(12) United States Patent
Mou et al.

(10) Patent No.: US 10,746,169 B2
(45) Date of Patent: *Aug. 18, 2020

(54) MINIATURE PNEUMATIC DEVICE

(71) Applicant: Microjet Technology Co., Ltd., Hsinchu (TW)

(72) Inventors: Hao-Jan Mou, Hsinchu (TW); Yung-Lung Han, Hsinchu (TW); Chi-Feng Huang, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 184 days.

This patent is subject to a terminal disclaimer.

(21) Appl. No.: 15/808,231

(22) Filed: Nov. 9, 2017

(65) Prior Publication Data

US 2018/0128263 A1    May 10, 2018

Related U.S. Application Data

(63) Continuation-in-part of application No. 15/391,999, filed on Dec. 28, 2016.

(30) Foreign Application Priority Data

Nov. 10, 2016    (TW) .............................. 105136558 A

(51) Int. Cl.
*F04B 43/09* (2006.01)
*F04B 45/047* (2006.01)
(Continued)

(52) U.S. Cl.
CPC .......... *F04B 43/095* (2013.01); *F04B 43/046* (2013.01); *F04B 45/047* (2013.01);
(Continued)

(58) Field of Classification Search
CPC ........ F04B 45/047; F04B 45/04; F04B 43/04; F04B 43/046; F04B 43/095; F16K 99/0048

See application file for complete search history.

(56) References Cited

U.S. PATENT DOCUMENTS 5,079,472 A    1/1992    Uhl et al.
5,171,132 A    12/1992    Miyazaki et al.
(Continued)

FOREIGN PATENT DOCUMENTS

CN    102046978    5/2011
CN    102057163    5/2011
(Continued)

OTHER PUBLICATIONS

U.S. Office Action for U.S. Appl. No. 15/808,021, dated Dec. 11, 2019.
(Continued)

*Primary Examiner* — Kenneth J Hansen
(74) *Attorney, Agent, or Firm* — Birch, Stewart, Kolasch & Birch, LLP

(57) ABSTRACT

A miniature pneumatic device includes a miniature fluid control device and a miniature valve device. The miniature fluid control device includes a gas inlet plate, a resonance plate, a piezoelectric actuator and a gas collecting plate. The length and width of the gas collecting plate are between 4 mm and 10 mm. A first chamber is formed between the resonance plate and the piezoelectric actuator. After a gas is fed into the gas inlet plate, the gas is transferred to the first chamber through the resonance plate and then transferred downwardly. Consequently, a pressure gradient is generated to continuously push the gas. The miniature valve device includes a valve film and a gas outlet plate. After the gas is transferred from the miniature fluid control device to the miniature valve device, the valve opening of the valve film (Continued)

is correspondingly opened or closed and the gas is transferred in one direction.

1 Claim, 14 Drawing Sheets

(51) Int. Cl.
    *H01L 41/09*     (2006.01)
    *F04B 53/10*     (2006.01)
    *F04B 43/04*     (2006.01)

(52) U.S. Cl.
    CPC .......... *F04B 53/10* (2013.01); *F04B 53/1067* (2013.01); *H01L 41/0973* (2013.01)

(56) References Cited

U.S. PATENT DOCUMENTS

| | | | |
|---|---|---|---|
| 5,267,589 A | 12/1993 | Watanabe | |
| 5,588,466 A | 12/1996 | Benz et al. | |
| 5,834,864 A | 11/1998 | Hesterman | |
| 6,000,676 A | 12/1999 | Zengerle et al. | |
| 6,123,316 A | 9/2000 | Biegelsen et al. | |
| 6,142,444 A | 11/2000 | Kluge | |
| 6,261,066 B1 | 7/2001 | Linnemann et al. | |
| 6,481,984 B1 | 11/2002 | Shinohara et al. | |
| 6,698,454 B2 | 3/2004 | Sjolander et al. | |
| 6,715,733 B2 | 4/2004 | Wang et al. | |
| 7,607,455 B2 | 10/2009 | Furukawa et al. | |
| 7,667,560 B2 | 2/2010 | Taya et al. | |
| 8,596,998 B2 | 12/2013 | Fujisaki et al. | |
| 9,028,226 B2 | 5/2015 | Hirata et al. | |
| 9,611,843 B2 | 4/2017 | Hsueh et al. | |
| 9,976,673 B2 | 5/2018 | Chen et al. | |
| 9,989,047 B2 | 6/2018 | Chen et al. | |
| 10,180,199 B2 | 1/2019 | Huang et al. | |
| 2002/0186860 A1 | 12/2002 | Ogura et al. | |
| 2003/0143122 A1* | 7/2003 | Sander ............... | B01L 3/0268 422/503 |
| 2004/0013548 A1 | 1/2004 | Seto et al. | |
| 2004/0137300 A1 | 7/2004 | Gemmen et al. | |
| 2005/0104941 A1 | 5/2005 | Tanaka | |
| 2006/0082254 A1 | 4/2006 | Kita | |
| 2006/0159295 A1 | 7/2006 | Onishi et al. | |
| 2009/0085441 A1 | 4/2009 | Morris et al. | |
| 2009/0232683 A1 | 9/2009 | Hirata et al. | |
| 2009/0242060 A1 | 10/2009 | Chen et al. | |
| 2009/0261688 A1 | 10/2009 | Xie et al. | |
| 2011/0076170 A1 | 3/2011 | Fujisaki et al. | |
| 2011/0190670 A1 | 8/2011 | Jaeb et al. | |
| 2012/0171062 A1 | 7/2012 | Kodama et al. | |
| 2013/0071269 A1 | 3/2013 | Fujisaki et al. | |
| 2013/0223979 A1 | 8/2013 | Lock et al. | |
| 2013/0323085 A1 | 12/2013 | Hirata et al. | |
| 2014/0346928 A1 | 11/2014 | Jun | |
| 2014/0377099 A1* | 12/2014 | Hsueh ............... | F04B 43/046 417/413.2 |
| 2015/0071797 A1 | 3/2015 | Takeuchi | |
| 2015/0114222 A1 | 4/2015 | Murakami | |
| 2016/0076530 A1 | 3/2016 | Chen | |
| 2018/0066768 A1 | 3/2018 | Han et al. | |
| 2018/0128256 A1 | 5/2018 | Mou et al. | |

FOREIGN PATENT DOCUMENTS

| | | |
|---|---|---|
| CN | 102444566 | 5/2012 |
| CN | 102979706 | 3/2013 |
| CN | 103140674 | 6/2013 |
| CN | 203476669 | 3/2014 |
| CN | 203476838 | 3/2014 |
| CN | 203488347 U | 3/2014 |
| CN | 104234986 | 12/2014 |
| CN | 104235081 A | 12/2014 |
| CN | 104246228 | 12/2014 |
| CN | 104302913 | 1/2015 |
| CN | 104632588 A | 5/2015 |
| CN | 105484982 A | 4/2016 |
| CN | 205383064 U | 7/2016 |
| EP | 2343456 A1 | 7/2011 |
| EP | 2557312 | 2/2013 |
| EP | 2762725 A1 | 8/2014 |
| EP | 3203079 A1 | 8/2017 |
| JP | S58104379 A | 6/1983 |
| JP | H07122966 A | 5/1995 |
| JP | 2004328055 A | 11/2004 |
| JP | 2005299597 A | 10/2005 |
| JP | 2006522896 A | 10/2006 |
| JP | 2009057963 A | 3/2009 |
| JP | 2009131740 A | 6/2009 |
| JP | 2009156454 A | 7/2009 |
| JP | 2009293566 A | 12/2009 |
| JP | 2010214633 A | 9/2010 |
| JP | 2012151651 A | 8/2012 |
| JP | 2013050108 | 3/2013 |
| JP | 2013057247 A | 3/2013 |
| JP | 2013117211 A | 6/2013 |
| JP | 2013119877 A | 6/2013 |
| JP | 2013245649 A | 12/2013 |
| JP | 5692465 B2 | 4/2015 |
| JP | 2017133507 A | 8/2017 |
| JP | 2017133510 A | 8/2017 |
| TW | 200303845 A | 9/2003 |
| TW | 561223 | 11/2003 |
| TW | 200909684 A | 3/2009 |
| TW | 200938730 | 9/2009 |
| TW | M465471 | 11/2013 |
| TW | M467740 | 12/2013 |
| TW | M481312 | 7/2014 |
| TW | 201500151 | 1/2015 |
| TW | 201500670 A | 1/2015 |
| TW | 201501807 | 1/2015 |
| TW | M513272 | 12/2015 |
| TW | 201610298 A | 3/2016 |
| TW | M528306 U | 9/2016 |
| TW | M529794 U | 10/2016 |
| TW | M530883 U | 10/2016 |
| TW | M535746 | 1/2017 |
| WO | 2009145064 A1 | 12/2009 |
| WO | 2011145544 A1 | 7/2013 |
| WO | 2013187271 | 12/2013 |
| WO | 2015087086 A1 | 6/2015 |
| WO | 2016013390 A1 | 1/2016 |

OTHER PUBLICATIONS

U.S. Notice of Allowance for U.S. Appl. No. 15/392,036, dated Jul. 31, 2019.

U.S. Office Action for U.S. Appl. No. 15/392,061, dated Jul. 29, 2019.

U.S. Office Action for U.S. Appl. No. 15/808,177, dated Sep. 30, 2019.

* cited by examiner

MINIATURE PNEUMATIC DEVICE

CROSS-REFERENCE TO RELATED APPLICATION

This application is a continuation-in-part application of U.S. application Ser. No. 15/391,999 filed on Dec. 28, 2016, and claims the priority to Taiwan Patent Application No. 105136558 filed on Nov. 10, 2016, the entirety of which is hereby incorporated by reference.

FIELD OF THE INVENTION

The present invention relates to a pneumatic device, and more particularly to a slim and silent miniature pneumatic device.

BACKGROUND OF THE INVENTION

With the advancement of science and technology, fluid transportation devices used in many sectors such as pharmaceutical industries, computer techniques, printing industries or energy industries are developed toward elaboration and miniaturization. The fluid transportation devices are important components that are used in for example micro pumps, micro atomizers, printheads or industrial printers. Therefore, it is important to provide an improved structure of the fluid transportation device.

For example, in the pharmaceutical industries, pneumatic devices or pneumatic machines use motors or pressure valves to transfer gases. However, due to the volume limitations of the motors and the pressure valves, the pneumatic devices or the pneumatic machines are bulky in volume. In other words, the conventional pneumatic device fails to meet the miniaturization requirement, and is not suitable to be installed in or cooperated with a portable equipment. Moreover, during operations of the motor or the pressure valve, annoying noise is readily generated.

Therefore, there is a need of providing a miniature pneumatic device with small, miniature, silent, portable and comfortable benefits in order to eliminate the above drawbacks.

SUMMARY OF THE INVENTION

The present invention provides a miniature pneumatic device for use with a portable or wearable equipment or machine. The miniature pneumatic device is a combination of a miniature fluid control device and a miniature valve device. The miniature pneumatic device of the present invention is small, slim, portable and silent. Consequently, the drawbacks of the conventional pneumatic device are overcome.

In accordance with an aspect of the present invention, a miniature pneumatic device is provided. The miniature pneumatic device includes a miniature fluid control device and a miniature valve device. The miniature fluid control device includes a gas inlet plate, a resonance plate, a piezoelectric actuator and a gas collecting plate. The resonance plate has a central aperture. A length of the gas collecting plate is in a range between 4 mm and 10 mm. A width of the gas collecting plate is in a range between 4 mm and 10 mm. A length/width ratio of the gas collecting plate is in a range between 0.4 and 2.5. The gas inlet plate, the resonance plate, the piezoelectric actuator and the gas collecting plate are stacked on each other sequentially. A gap is formed between the resonance plate and the piezoelectric actuator to define a first chamber. When the piezoelectric actuator is actuated, a gas is fed into the miniature fluid control device through the gas inlet plate, transferred through the resonance plate, introduced into the first chamber, and further transferred. The miniature valve device includes a valve film and a gas outlet plate. The gas collecting plate, the valve film and the gas outlet plate are combined together. The valve film has a valve opening, and a length and a width of the gas outlet plate are identical to those of the gas collecting plate. After the gas is transferred from the miniature fluid control device to the miniature valve device, a pressure-collecting operation or a pressure-releasing operation is selectively performed.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a miniature pneumatic device. The miniature pneumatic device may be used in many sectors such as pharmaceutical industries, energy industries, computer techniques or printing industries for transporting gases.

Figure 1A:
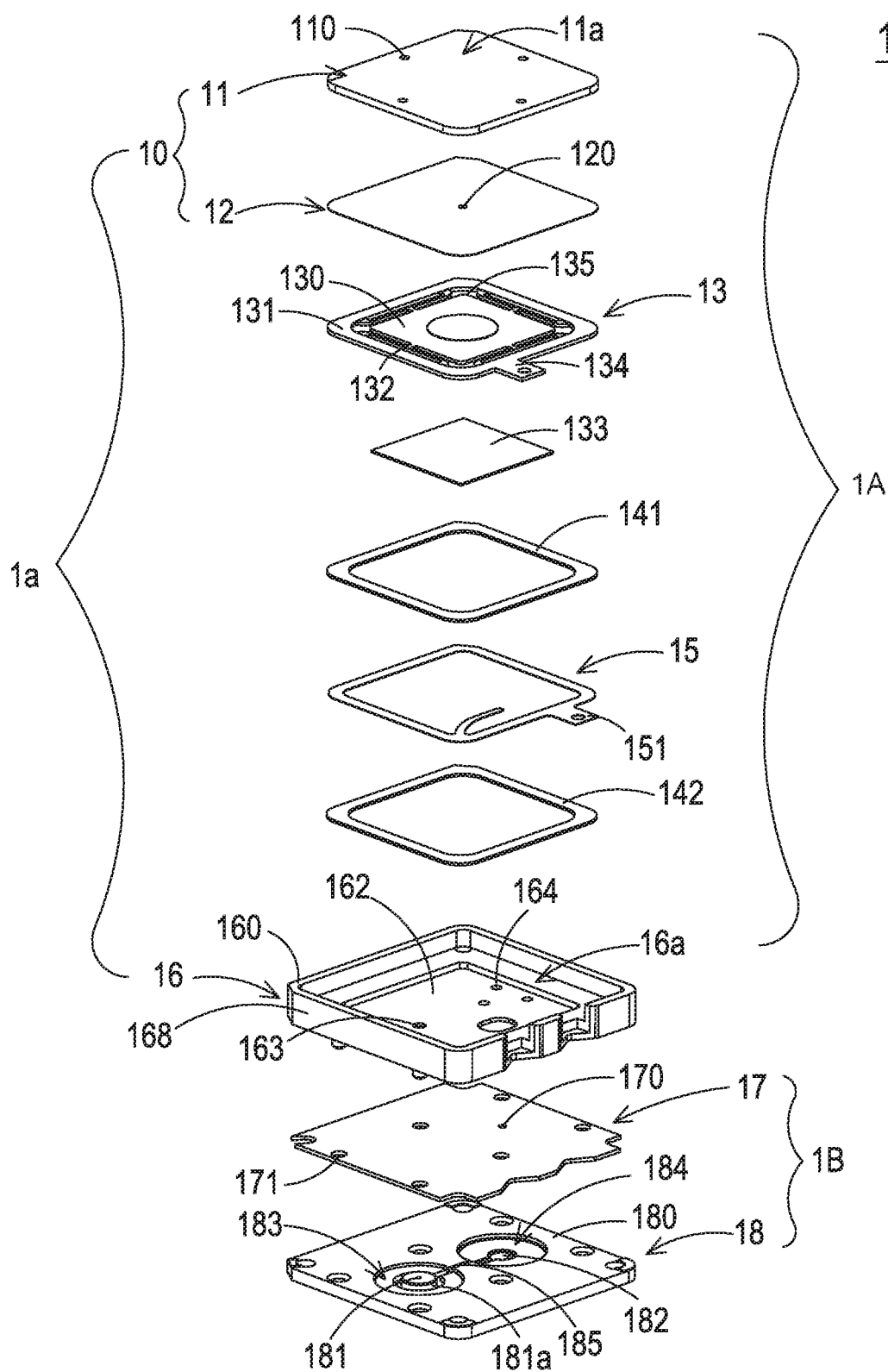
FIG. 1A is a schematic exploded view illustrating a miniature pneumatic device according to an embodiment of the present invention and taken along a first viewpoint.
Figure 1B:
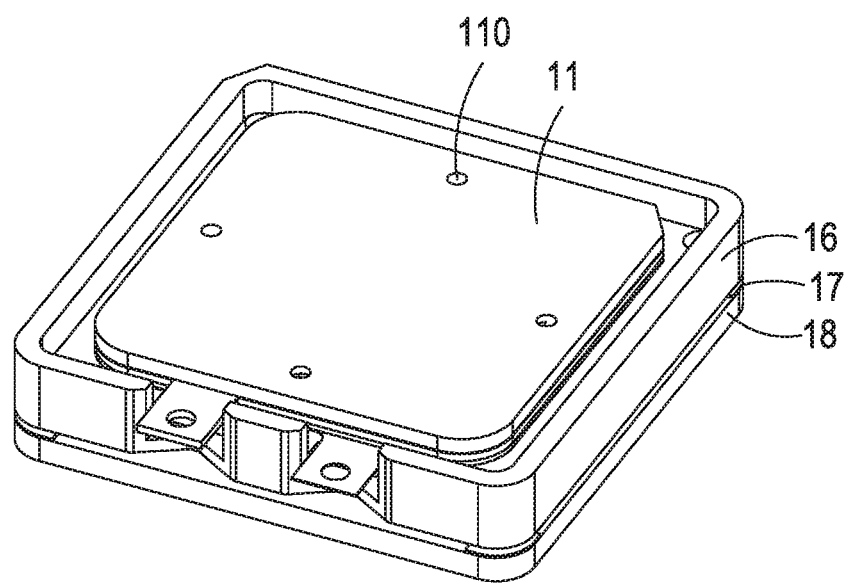
FIG. 1B is a schematic assembled view illustrating the miniature pneumatic device of FIG. 1A.
Figure 2A:
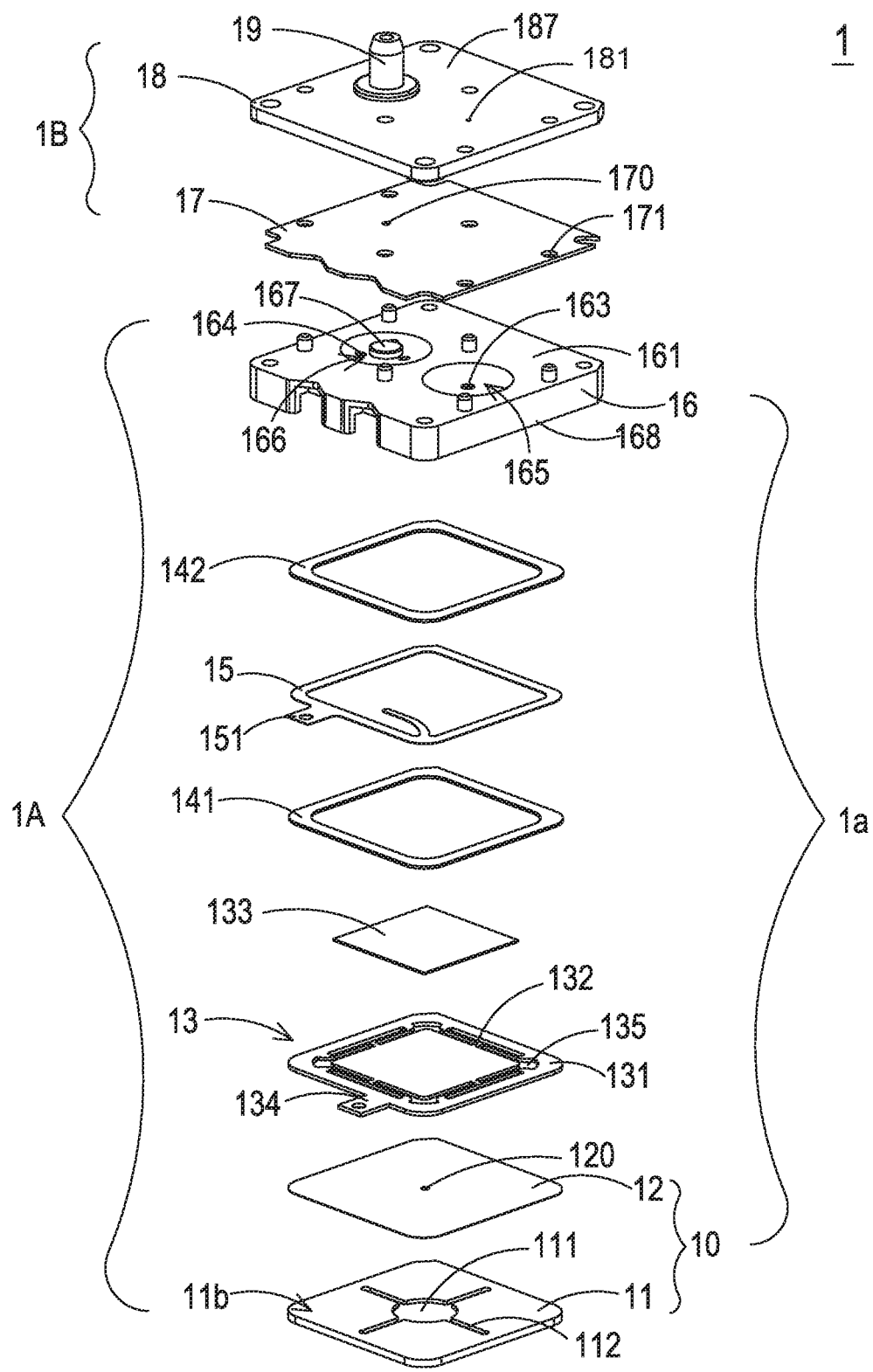
FIG. 2A is a schematic exploded view illustrating the miniature pneumatic device according to the embodiment of the present invention and taken along a second viewpoint.
Figure 2B:
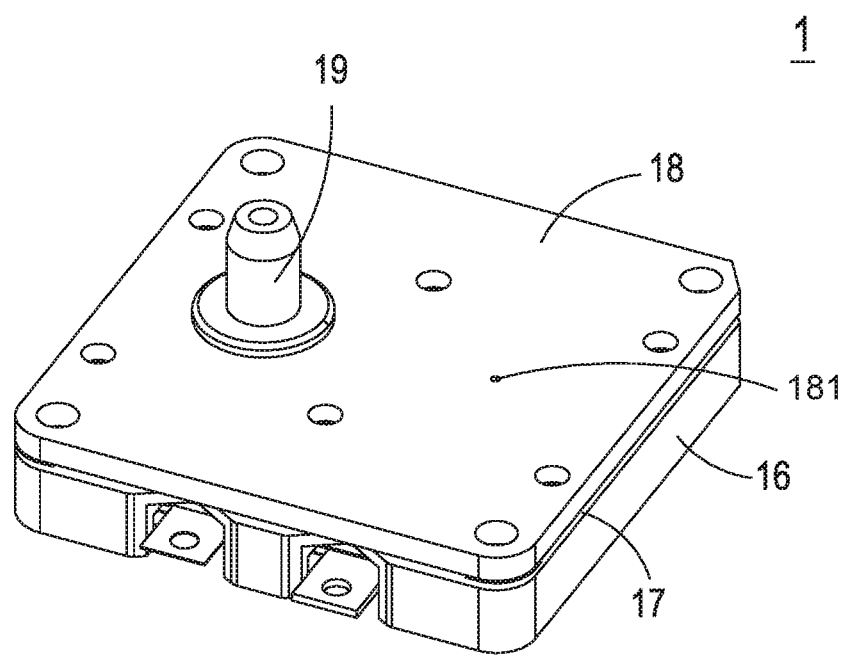
FIG. 2B is a schematic assembled view illustrating the miniature pneumatic device of FIG. 2A.

Please refer to FIGS. 1A, 1B, 2A, 2B and 7A to 7E. FIG. 1A is a schematic exploded view illustrating a miniature pneumatic device according to an embodiment of the present invention and taken along a first viewpoint. FIG. 1B is a schematic assembled view illustrating the miniature pneumatic device of FIG. 1A. FIG. 2A is a schematic exploded view illustrating the miniature pneumatic device according to the embodiment of the present invention and taken along a second viewpoint. FIG. 2B is a schematic assembled view illustrating the miniature pneumatic device of FIG. 2A. FIGS. 7A to 7E schematically illustrate a gas-collecting operation of the miniature pneumatic device of FIG. 1A.

As shown in FIGS. 1A and 2A, the miniature pneumatic device 1 comprises a miniature fluid control device 1A and a miniature valve device 1B. In this embodiment, the miniature fluid control device 1A comprises a housing 1a, a piezoelectric actuator 13, a first insulation plate 141, a conducting plate 15 and a second insulation plate 142. The housing 1a comprises a gas collecting plate 16 and a base 10. The base 10 is composed of a gas inlet plate 11 and a resonance plate 12. The piezoelectric actuator 13 is aligned with the resonance plate 12. The gas inlet plate 11, the resonance plate 12, the piezoelectric actuator 13, the first insulation plate 141, the conducting plate 15, the second insulation plate 142 and the gas collecting plate 16 are stacked on each other sequentially to be assembled while an outward surface of the gas inlet plate 11 is towards an input side. Moreover, the piezoelectric actuator 13 comprises a suspension plate 130, an outer frame 131, at least one bracket 132 and a piezoelectric ceramic plate 133. In this embodiment, the miniature valve device 1B comprises a valve film 17 and a gas outlet plate 18.

As shown in FIG. 1A, the gas collecting plate 16 may comprise a bottom plate and a sidewall 168 protruding from the edges of the bottom plate. The gas collecting plate 16 may have a length and a width both in the range between 4 mm and 10 mm, while the length/width ratio of the gas collecting plate 16 is in the range between 0.4 and 2.5. Alternatively, the length and the width of the gas collecting plate 16 are both in the range between 6 mm and 8 mm, while the length/width ratio of the gas collecting plate 16 is in the range between 0.75 and 1.33. Preferably, the length and the width of the gas collecting plate 16 are both 6 mm.

The bottom plate and the sidewall 168 collaboratively define an accommodation space 16a where the piezoelectric actuator 13 is disposed within. The structure of the miniature pneumatic device 1 in assembled state, taken from the front side, is shown in FIG. 1B and FIGS. 7A to 7E. As the miniature fluid control device 1A and the miniature valve device 1B are combined together, the valve film 17 and the gas outlet plate 18 of the miniature valve device 1B are stacked on each other and positioned on the bottom side of the gas collecting plate 16 of the miniature fluid control device 1A. Please refer to FIG. 1A and FIG. 2B, the gas outlet plate 18 has a pressure-releasing perforation 181 and an outlet structure 19. The outlet structure 19 is adapted to be in communication with an inner space of a target equipment (not shown), and the pressure-releasing perforation 181 is adapted to discharge the gas inside the miniature valve device 1B. As so, the gas pressure of the inner space of the target equipment can be released.

The miniature pneumatic device 1 in assembled state allows a gas to be fed into the miniature fluid control device 1A through at least one inlet 110 of the gas inlet plate 11 from the input side. The piezoelectric actuator 13 is operable to be activated, and in response of the actions of the piezoelectric actuator 13, the gas is transferred downwardly through plural pressure chambers (not shown) to the miniature valve device 1B. In the miniature valve device 1B, the gas is transferred in one direction, being discharged from the outlet structure 19 and flows into the inner space of the target equipment (not shown). As a result, the pressure of the gas in the inner space of the target equipment is accumulated.

Please refer to FIGS. 1A and 2A again. The gas inlet plate 11 of the miniature fluid control device 1A comprises a first surface 11b, a second surface 11a and the at least one inlet 110. In this embodiment, the gas inlet plate 11 has four inlets 110. The inlets 110 run through the first surface 11b and the second surface 11a of the gas inlet plate 11, and the second surface 11a is towards exterior of the miniature pneumatic device 1 where is defined as the input side. In response to the action of the atmospheric pressure, the gas is introduced into the miniature fluid control device 1A through the inlets 110. As shown in FIG. 2A, at least one convergence channel 112 is formed on the first surface 11b of the gas inlet plate 11, and is in communication with the at least one inlet 110 of the gas inlet plate 11. Moreover, a central cavity 111 is formed on the first surface 11b of the gas inlet plate 11 and located at the intersection of the four convergence channels 112 that forming a convergence chamber for temporarily storing the gas. The central cavity 111 is in communication with all of the convergence channels 112, such that the gas entered by the inlets 110 would be introduced into the at least one convergence channel 112 and is guided to the central cavity 111. In this embodiment, the at least one inlet 110, the at least one convergence channel 112 and the central cavity 111 of the gas inlet plate 11 are integrally formed.

Preferably but not exclusively, the gas inlet plate 11 is made of stainless steel. The thickness of the gas inlet plate 11 is in the range between 0.3 mm and 0.5 mm, and preferably 0.4 mm. In some embodiments, the depth of the convergence chamber defined by the central cavity 111, is equal to the depth of the at least one convergence channel, both of which are preferably in the range between 0.15 mm and 0.25 mm. The resonance plate 12 is made of a flexible material, which is preferably but not exclusively copper. The resonance plate 12 further has a central aperture 120 corresponding to the central cavity 111 of the gas inlet plate 11 that providing the gas for flowing through. The thickness of the resonance plate 12 is in the range between 0.02 mm and 0.07 mm, and preferably 0.04 mm.

Figure 3A:
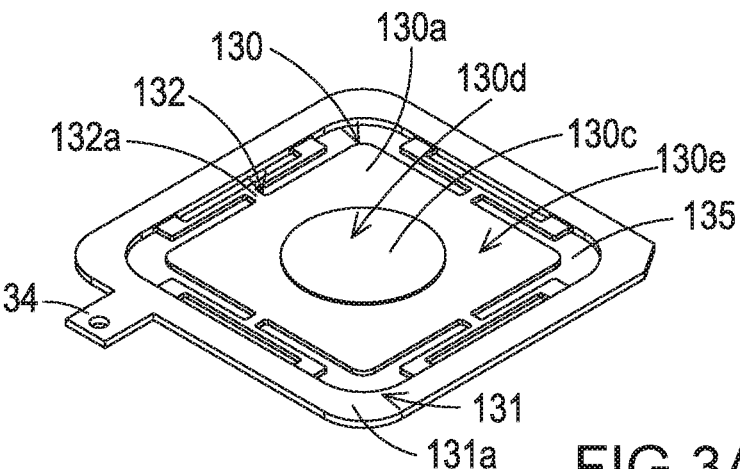
FIG. 3A is a schematic perspective view illustrating the piezoelectric actuator of the miniature pneumatic device of FIG. 1A and taken along the front side.
Figure 3B:
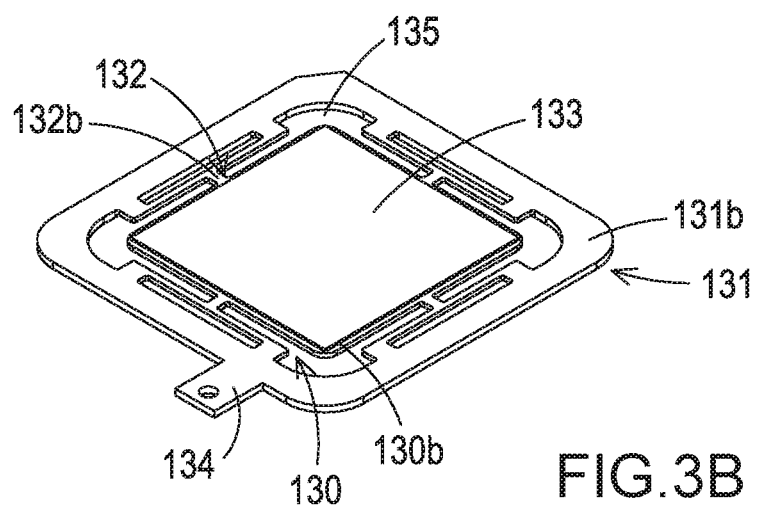
FIG. 3B is a schematic perspective view illustrating the piezoelectric actuator of the miniature pneumatic device of FIG. 1A and taken along the rear side.
Figure 3C:
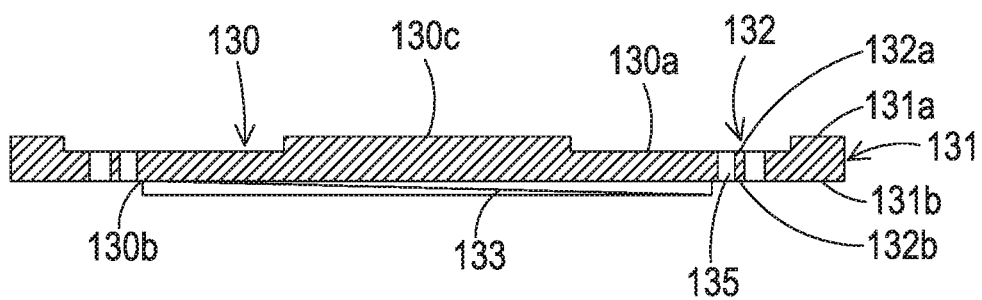
FIG. 3C is a schematic cross-sectional view illustrating the piezoelectric actuator of the miniature pneumatic device of FIG. 1A.

FIG. 3A is a schematic perspective view illustrating the piezoelectric actuator of the miniature pneumatic device of FIG. 1A and taken along the front side. FIG. 3B is a schematic perspective view illustrating the piezoelectric actuator of the miniature pneumatic device of FIG. 1A and taken along the rear side. FIG. 3C is a schematic cross-sectional view illustrating the piezoelectric actuator of the miniature pneumatic device of FIG. 1A. As shown in FIGS. 3A, 3B and 3C, the piezoelectric actuator 13 comprises the suspension plate 130, the outer frame 131, the at least one bracket 132, and the piezoelectric ceramic plate 133. The piezoelectric ceramic plate 133 is attached on a first surface 130b of the suspension plate 130. In response to an applied voltage, the piezoelectric ceramic plate 133 would be subjected to a curvy vibration. The suspension plate 130 comprises a middle portion 130d and a periphery portion 130e. When the piezoelectric ceramic plate 133 is subjected to the curvy vibration, the suspension plate 130 is also subjected to the curvy vibration and vibrates from the middle portion 130d to the periphery portion 130e. The at least one bracket 132 is connected between the suspension plate 130 and the outer frame 131, while two ends of the bracket 132 are connected with the outer frame 131 and the suspension plate 130 respectively that the bracket 131 can elastically support the suspension plate 130. At least one vacant space 135 is formed between the bracket 132, the suspension plate 130 and the outer frame 131 for allowing the gas to go through. The type of the suspension plate 130 and the outer frame 131 and the type and the number of the at least one bracket 132 may be varied according to the practical requirements. Moreover, a conducting pin 134 is protruding outwardly from the outer frame 131 so as to be electrically connected with an external circuit (not shown).

In this embodiment, the suspension plate 130 has a bulge 130c that makes the suspension plate 130 a stepped structure. The bulge 130c is formed on a second surface 130a of the suspension plate 130, wherein the second surface 130a is opposing to the first surface 130b. The bulge 130c may be a circular convex structure, the thickness of which is in the range between 0.02 mm and 0.08 mm, and preferably 0.03 mm. Preferably but not exclusively, the diameter of the bulge 130c is in a range between 1.1 mm and 2.4 mm. As shown in FIGS. 3A and 3C, a top surface of the bulge 130c of the suspension plate 130 is coplanar with a second surface 131a of the outer frame 131, while the second surface 130a of the suspension plate 130 is coplanar with a second surface 132a of the bracket 132. Moreover, there is a drop of specified amount from the bulge 130c of the suspension plate 130 (or the second surface 131a of the outer frame 131) to the second surface 130a of the suspension plate 130 (or the second surface 132a of the bracket 132). As shown in FIGS. 3B and 3C, a first surface 130b of the suspension plate 130, a first surface 131b of the outer frame 131 and a first surface 132b of the bracket 132 are coplanar with each other. The piezoelectric ceramic plate 133 is attached on the first surface 130b of the suspension plate 130. The suspension plate 130 may be a square plate structure with two flat surfaces but the type of the suspension plate 130 may be varied according to the practical requirements. In this embodiment, the suspension plate 130, the at least bracket 132 and the outer frame 131 are integrally formed and produced by using a metal plate (e.g., a stainless steel plate). The thickness of the suspension plate 130 is in the range between 0.1 mm and 0.3 mm, and preferably 0.2 mm. The length of the suspension plate 130 is in the range between 2 mm and 4.5 mm, and preferably in the range between 2.5 mm and 3.5 mm. The width of the suspension plate 130 is in the range between 2 mm and 4.5 mm, and preferably in the range between 2.5 mm and 3.5 mm. The thickness of the outer frame 131 is in the range between 0.1 mm and 0.4 mm, and preferably 0.3 mm.

The piezoelectric ceramic plate 133 has the same shape with the suspension plate 130 but in smaller size, which means the longest side of the piezoelectric ceramic plate 133 is always equal to or shorter than the longest side of the suspension plate 130. As the suspension plate 130 has a square shape in this embodiment, the piezoelectric ceramic plate 133 also has a square shape. The thickness of the piezoelectric ceramic plate 133 is in the range between 0.05 mm and 0.3 mm, and preferably 0.10 mm. The length of a side of the piezoelectric ceramic plate 133 is equal to or less than the length of a side of the suspension plate 130. Meanwhile, the length of the side of the piezoelectric ceramic plate 133 is in the range between 2 mm and 4.5 mm, and preferably in the range between 2.5 mm and 3.5 mm. In some other embodiments, the suspension plate 130 and the piezoelectric ceramic plate 133 may have a rectangular shape, and the width and the length of the rectangular shape is in the range between 2 mm and 4.5 mm, and preferably in the range between 2.5 mm and 3.5 mm. Moreover, the length/width ratio of the piezoelectric ceramic plate 133 is in the range between 0.44 and 2.25.

Preferably, the piezoelectric actuator 13 used in the miniature pneumatic device 1 of the present invention is a square piezoelectric actuator. The reason is that the square piezoelectric actuator is more power-saving in comparison with the circular one. The comparison between the consumed power and the operating frequency for the piezoelectric actuators of different types and sizes is shown in Table 1.

TABLE 1

| Type of piezoelectric actuator | Operating frequency | Consumed power |
| --- | --- | --- |
| Square (side length: 10 mm) | 18 kHz | 1.1 W |
| Circular (diameter: 10 mm) | 28 kHz | 1.5 W |
| Square (side length: 9 mm) | 22 kHz | 1.3 W |
| Circular (diameter: 9 mm) | 34 kHz | 2 W |
| Square (side length: 8 mm) | 27 kHz | 1.5 W |
| Circular (diameter: 8 mm) | 42 kHz | 2.5 W |

From the results of Table 1, it is found that the square piezoelectric actuator is more power-saving than the circular piezoelectric actuator of same size. That is, the piezoelectric actuator with the square suspension plate consumes less power. It is generally known that the consumed power of the capacitive load at the resonance frequency is positively related to the resonance frequency. Since the resonance frequency of the square piezoelectric actuator 13 is obviously lower than that of the circular piezoelectric actuator of same size, the consumed power of the square suspension plate is lower. Taking advantage of the power-saving square piezoelectric actuator 13, the miniature pneumatic device 1 would be suitably used in the wearable device.

Figure 4A:
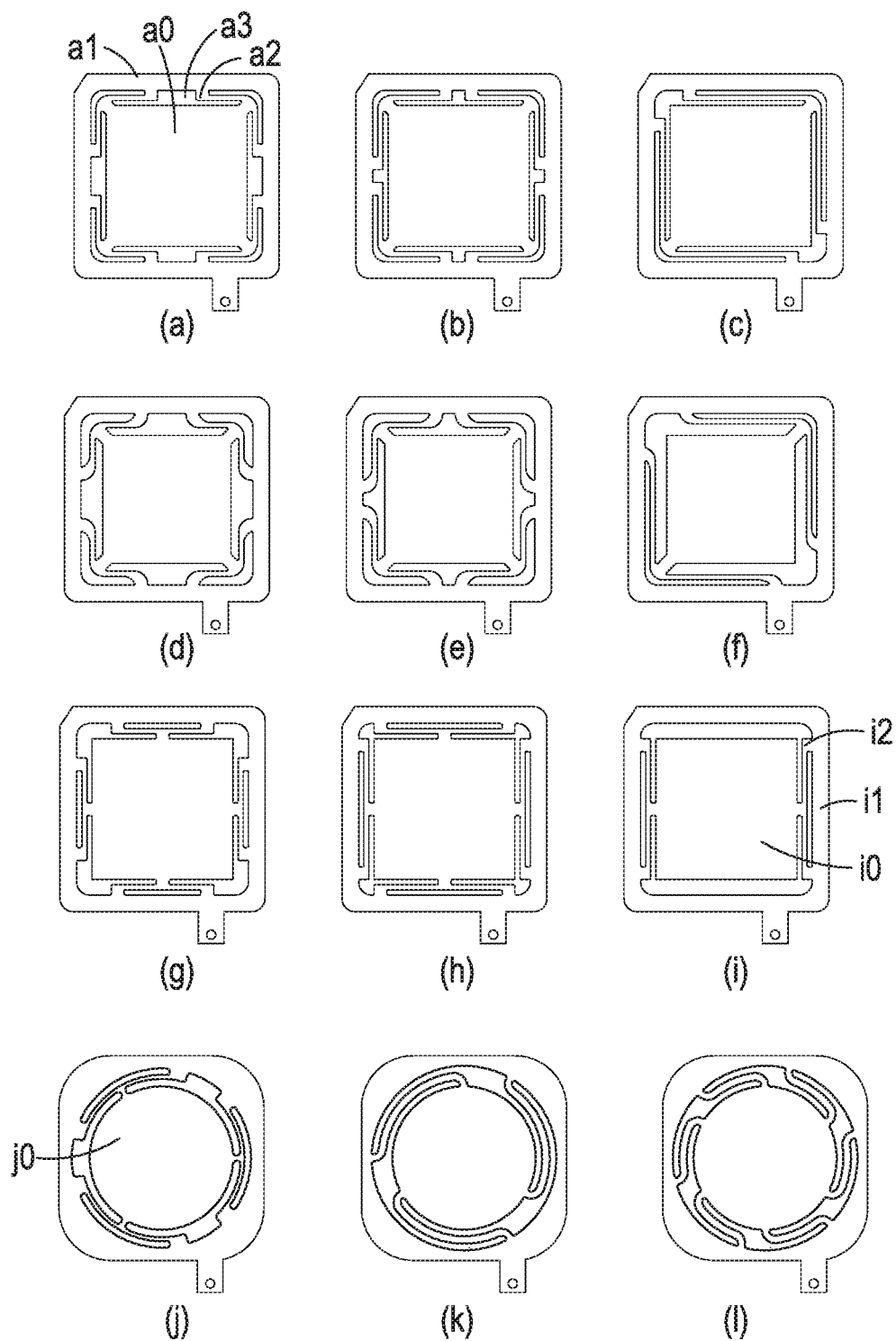
FIGS. 4A to 4C schematically illustrate various exemplary piezoelectric actuator used in the miniature pneumatic device of the present invention.
Figure 4B:
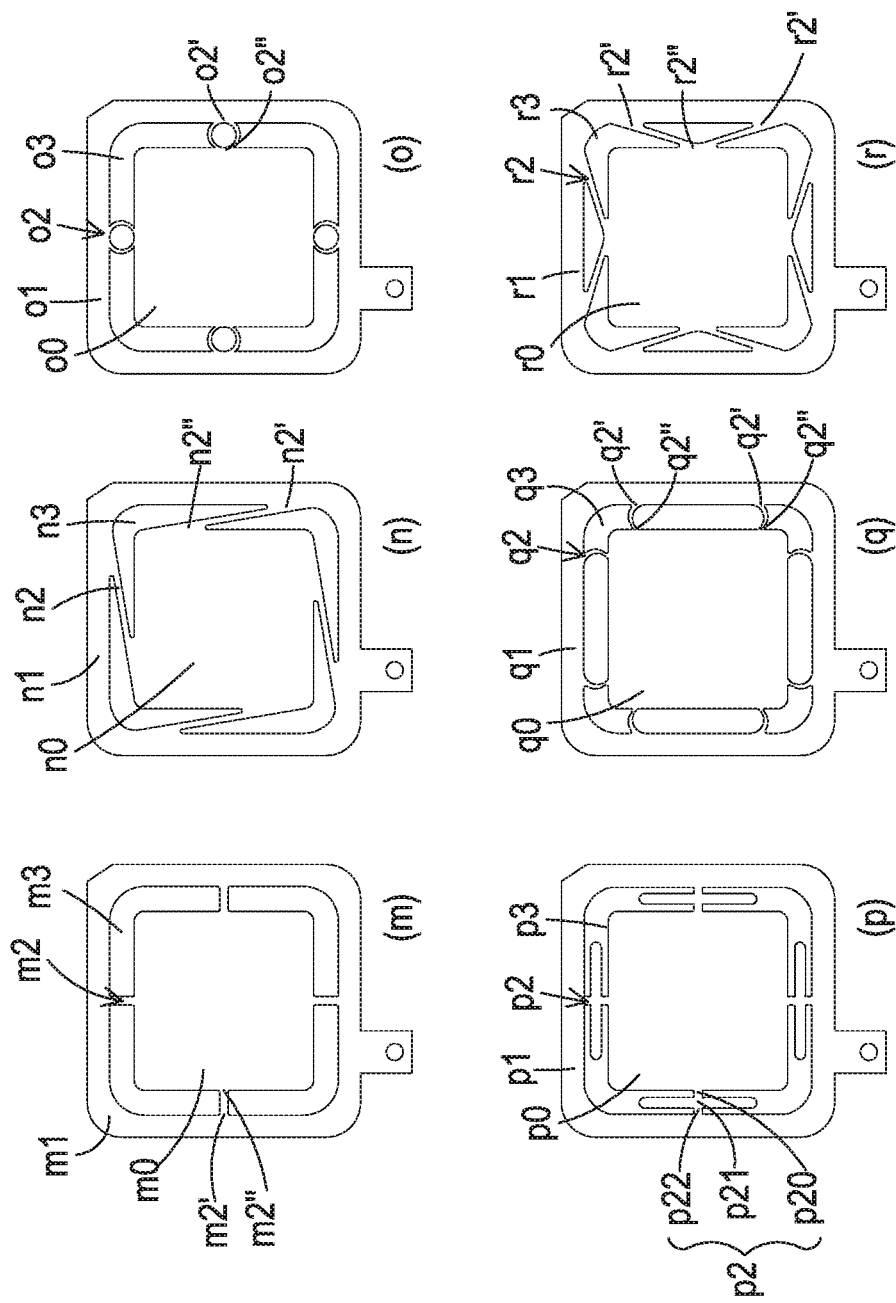
Figure 4C:
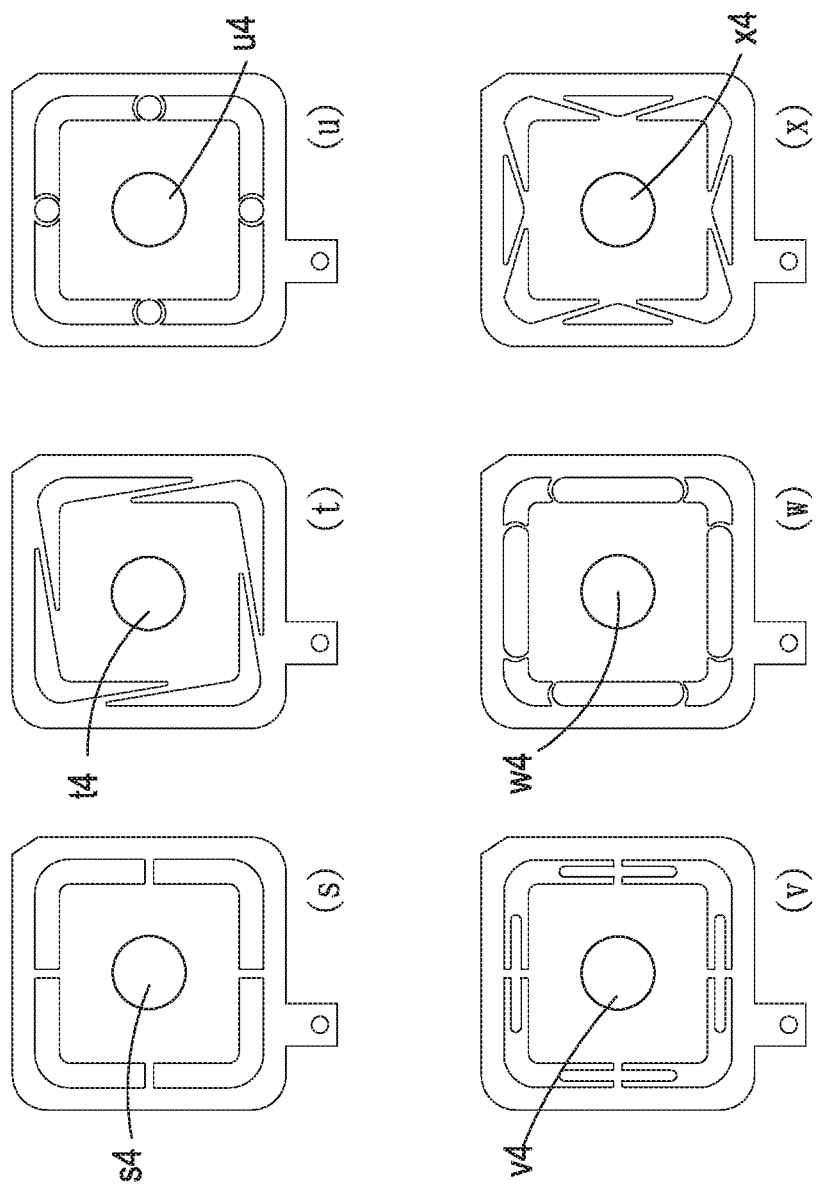

FIGS. 4A, 4B and 4C schematically illustrate various exemplary piezoelectric actuator used in the miniature pneumatic device of the present invention. As shown in the drawings, the suspension plate 130, the outer frame 131 and the at least one bracket 132 of the piezoelectric actuator 13 have various types.

FIG. 4A schematically illustrates the types (a)~(l) of the piezoelectric actuator. In the type (a), the outer frame a1 and the suspension plate a0 are square, the outer frame a1 and the suspension plate a0 are connected with each other through eight brackets a2, each two of which are disposed by one side of the square suspension plate a0. Several vacant spaces a3 are formed between the brackets a2, the suspension plate a0 and the outer frame a1 for allowing the gas to go through. In the type (i), the outer frame it and the suspension plate i0 are also square, but the outer frame it and the suspension plate i0 are connected with each other through merely two brackets i2. In addition, the outer frame it and the suspension plate i0 in each of the types (b)~(h) are also square. In each of the types (j)~(l), the suspension plate is circular, and the outer frame has a square with arc-shaped corners. For example, in the type (j), the suspension plate j0 is circular, and the outer frame has a square with arc-shaped corners. As mentioned above, the suspension plate 130 has a square or circular shape, and the piezoelectric ceramic plate 133 is attached on the first surface 130b of the suspension plate 130 also has the square or circular shape.

FIG. 4B schematically illustrates the types (m)~(r) of the piezoelectric actuator. In these types (m)~(r), the suspension plate 130 and the outer frame 131 are square. In the type (m), the outer frame m1 and the suspension plate m0 are square, the outer frame m1 and the suspension plate m0 are connected with each other through four brackets m2, each of which is disposed by one side of the suspension plate m0. Meanwhile, a vacant space m3 is formed between the brackets m2, the suspension plate m0 and the outer frame m1. The bracket m2 has two ends m2' and m2" respectively connected with the outer frame m1 and the suspension plate m0. The two ends m2' and m2" are opposed to each other and arranged along the same horizontal line.

In the type (n), the outer frame n1 and the suspension plate n0 are also connected with each other through four brackets n2, and a vacant space n3 is formed between the brackets n2, the suspension plate n0 and the outer frame n1. Nonetheless, the two ends n2' and n2" of the bracket n2, which are respectively connected with the outer frame n1 and the suspension plate n0, are not arranged along the same horizontal line. Instead, the two ends n2' and n2" are inclined at 0~45 degrees with respect to the horizontal line.

In the type (o), the outer frame of and the suspension plate o0 are square, the outer frame o1 and the suspension plate o0 are connected with each other through four brackets o2 in circular profiles, and a vacant space o3 is formed between each two of the brackets o2, the suspension plate o0 and the outer frame o1. The bracket o2 includes a connecting part and two ends o2' and o2". The end o2' of the bracket o2 is connected with the outer frame o1. The end o2" of the bracket o2 is connected with the suspension plate o0. The two ends o2' and o2" are opposed to each other and arranged along the same horizontal line.

In the type (p), the outer frame p1 and the suspension plate p0 are square, the outer frame p1 and the suspension plate p0 are connected with each other through four brackets p2, and a vacant space p3 is formed between each two of the brackets p2, the suspension plate p0 and the outer frame p1. The bracket p2 includes a first connecting part p20, an intermediate part p21 and a second connecting part p22. The intermediate part p21 is formed in the vacant space p3 and in parallel with the outer frame p1 and the suspension plate p0. The first connecting part p20 is arranged between the intermediate part p21 and the suspension plate p0. The second connecting part p22 is arranged between the intermediate part p21 and the outer frame p1. The first connecting part p20 and the second connecting part p22 are opposed to each other and arranged along the same horizontal line.

More specifically, the intermediate part p21 is a bar perpendicular to both the first connecting part p20 and the second connecting part p22, which makes the bracket p2 in the shape of a cross. Thus, the whole structure of the bracket p2 is strengthened, which is beneficial for vibration of the suspension plate p0 in a fixed direction. Meanwhile, the bracket p2 can be made of a material with a lesser rigidity, and therefore increases vibration frequency of the suspension plate p0. As a result, the gas pressure output efficiency could be improved.

In the type (q), the outer frame q1, the suspension plate q0, the bracket q2 and the vacant space q3 are similar to those of the type (m) and the type (o). Each side of the suspension plate q0 is connected with the corresponding side of the outer frame q1 through two connecting parts q2. The two ends q2' and q2" of each connecting part q2 are opposed to each other and arranged along the same horizontal line. In the type (r), the outer frame r1, the suspension plate r0, the bracket r2 and the vacant space r3 are similar to those of the above embodiments. However, the bracket r2 is a V-shaped connecting part. That is, the bracket r2 is connected with the outer frame r1 and the suspension plate r0 at an inclined angle 0~45 degrees. An end r2" of the bracket r2 is connected with the suspension plate r0, and two ends r2' of the bracket r2 are connected with the outer frame r1. That is, the ends b2' and b2" are not arranged along the same horizontal line.

FIG. 4C schematically illustrates the types (s)~(x) of the piezoelectric actuator. The structures of the types (s)~(x) are similar to those of the types (m)~(r), respectively. However, in the types (s)~(x), the suspension plate 130 of the piezoelectric actuator 13 has a bulge 130c. The bulges 130c in the types (s)~(x) are indicated as s4, t4, u4, v4, w4 and x4, respectively. Regarding the types (m)~(r) and the types (s)~(x) of the piezoelectric actuator, the suspension plate 130 and the outer frame 131 are square for achieving power-saving efficacy, and both the stepped structure with bulge and the flat structure with two flat surfaces are in the scope of the present invention. Meanwhile, the number of the brackets 132 between the outer frame 131 and the suspension plate 130 may be varied according to the practical requirements. The suspension plate 130, the outer frame 131 and the at least one bracket 132 may be integrally formed with each other and produced by but not limited to a conventional machining process, a photolithography and etching process, a laser machining process, an electroforming process, an electric discharge machining process and so on.

Please refer to FIGS. 1A and 2A again. The miniature fluid control device 1A further comprises the first insulation plate 141, the conducting plate 15 and the second insulation plate 142. The first insulation plate 141, the conducting plate 15 and the second insulation plate 142 are stacked on each other sequentially and located under the piezoelectric actuator 13. The profiles of the first insulation plate 141, the conducting plate 15 and the second insulation plate 142 substantially match the profile of the outer frame 131 of the piezoelectric actuator 13. The first insulation plate 141 and the second insulation plate 142 are made of an insulating material (e.g. a plastic material) for providing insulating efficacy. The conducting plate 15 is made of an electrically conductive material (e.g. a metallic material) for providing electrically conducting efficacy. Moreover, the conducting plate 15 has a conducting pin 151 so as to be electrically connected with an external circuit (not shown).

Figure 5A:
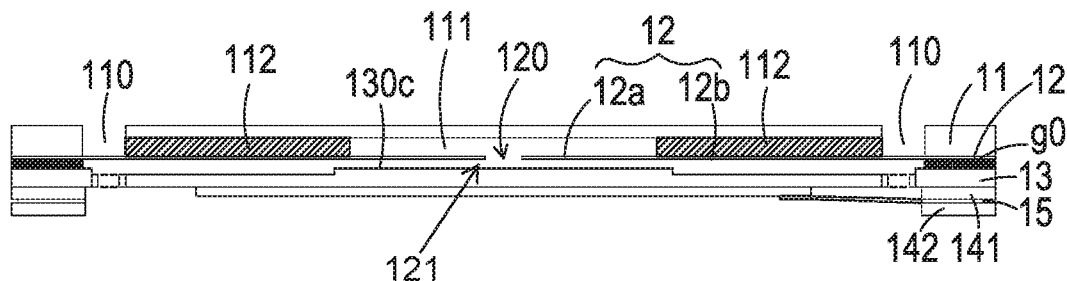
FIGS. 5A to 5E schematically illustrate the actions of the miniature fluid control device of the miniature pneumatic device of FIG. 1A.

FIGS. 5A to 5E schematically illustrate the actions of the miniature fluid control device of the miniature pneumatic device of FIG. 1A. As shown in FIG. 5A, the gas inlet plate 11, the resonance plate 12, the piezoelectric actuator 13, the first insulation plate 141, the conducting plate 15 and the second insulation plate 142 of the miniature fluid control device 1A are stacked on each other sequentially. Moreover, there is a gap g0 between the resonance plate 12 and the outer frame 131 of the piezoelectric actuator 13, which is formed and maintained by a filler (e.g. a conductive adhesive) inserted therein in this embodiment. The gap g0 ensures the proper distance between the resonance plate 12 and the bulge 130c of the suspension plate 130, so that the contact interference is reduced and the generated noise is largely reduced. In some other embodiments, the outer frame 131 is produced to be at a level higher than the piezoelectric actuator 13, so that the gap is formed between the resonance plate 12 and the piezoelectric actuator 13.

Please refer to FIGS. 5A to 5E again. A convergence chamber is defined by the resonance plate 12 and the central cavity 111 of the gas inlet plate 11 collaboratively for converging the gas. A first chamber 121 is formed between the resonance plate 12 and the piezoelectric actuator 13, and is in communication with the convergence chamber through the central aperture 120 of the resonance plate 12. Meanwhile, the peripheral regions of the first chamber 121 are in communication with the underlying miniature valve device 1B through the vacant spaces 135 of the piezoelectric actuator 13.

Figure 5B:
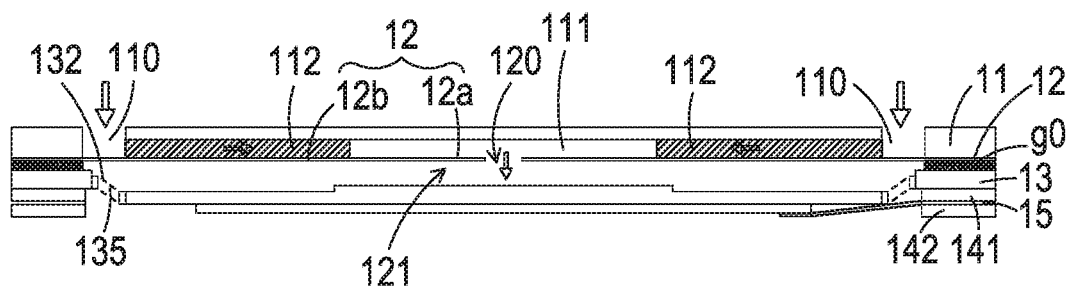

Please refer to FIG. 5B. When the miniature fluid control device 1A of the miniature pneumatic device 1 is enabled, the piezoelectric actuator 13 is actuated in response to an applied voltage. Consequently, the piezoelectric actuator 13 vibrates along a vertical direction in a reciprocating manner, while the brackets 132 are served as the fulcrums. The resonance plate 12 except for the part of it fixed on the gas inlet plate 11 is hereinafter referred as a movable part 12a, while the rest is referred as a fixed part 12b. Since the resonance plate 12 is light and thin, the movable part 12a vibrates along with the piezoelectric actuator 13 because of the resonance of the piezoelectric actuator 13. In other words, the movable part 12a is reciprocated and subjected to a curvy deformation.

Figure 5C:
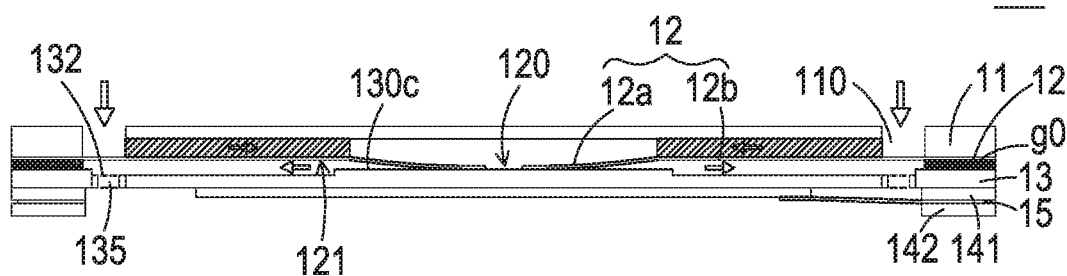

As shown in FIG. 5C, during the vibration of the movable part 12a of the resonance plate 12, the movable part 12a moves down till being contacted with the bulge 130c of the suspension plate 130. In the meantime, the volume of the first chamber 121 is shrunken and a middle space which was communicating with the convergence chamber is closed. As a result, the pressure gradient occurs to push the gas in the first chamber 121 moving toward peripheral regions of the first chamber 121 and flowing downwardly through the vacant spaces 135 of the piezoelectric actuator 13.

Figure 5D:
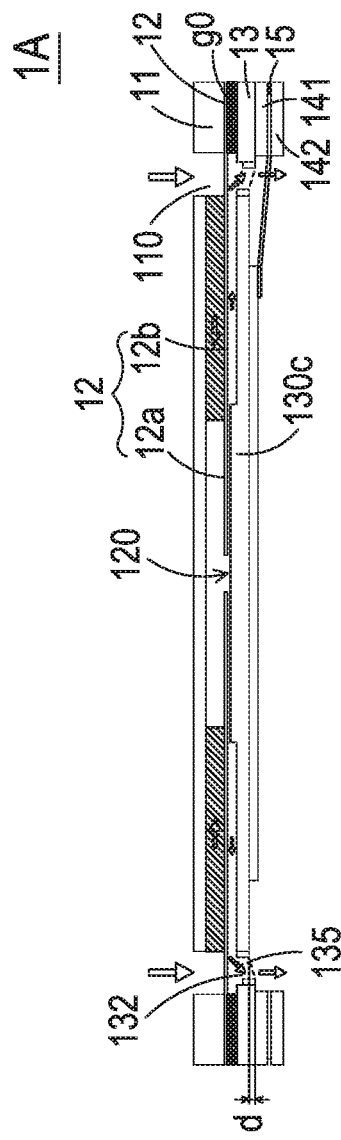

Please refer to FIG. 5D, which illustrates consecutive action following the action in FIG. 5C. The movable part 12a has returned its original position as the piezoelectric actuator 13 has ascended at a vibration displacement d to an upward position. Consequently, the volume of the first chamber 121 is consecutively shrunken that generating pressure gradient which makes the gas in the first chamber 121 continuously pushed toward peripheral regions and results in an exterior gas continuously fed into the inlets 110 of the gas inlet plate 11 and transferred to the central cavity 111.

Figure 5E:
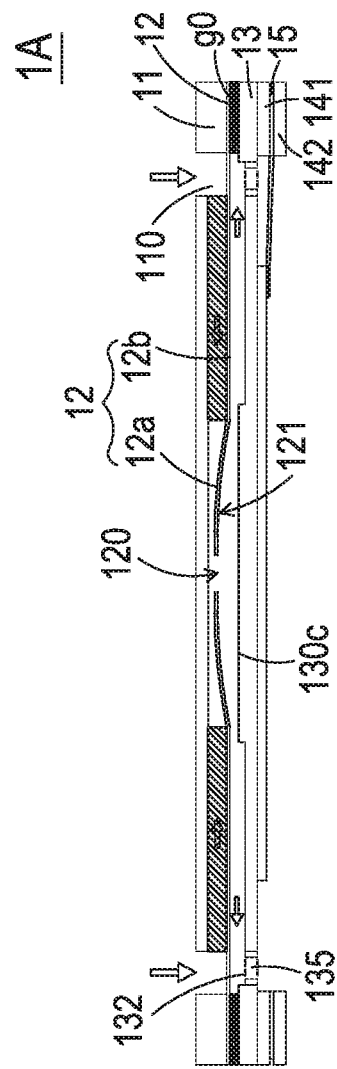

Then, as shown in FIG. 5E, the resonance plate 12 moves upwardly, which is caused by the resonance of the upward motion of the piezoelectric actuator 13. That is, the movable part 12a of the resonance plate 12 is returned to its original position. Under this circumstance, the volume of the first chamber 121 expends, which results in suction applied to the gas in the central cavity 111. The gas in the central cavity 111 is transferred to the first chamber 121 through the central aperture 120 of the resonance plate 12, then transferred downwardly through the vacant spaces 135 of the piezoelectric actuator 13, exiting from the miniature fluid control device 1A.

From the above description, please note the gap g0 between the resonance plate 12 and the piezoelectric actuator 13 providing space for vibration of the resonance plate 12. That is, the thickness of the gap g0 affects the amplitude of vibration of the resonance plate 12. A difference x between the gap g0 and the vibration displacement d of the piezoelectric actuator 13 is given by a formula: $x=g0-d$. A series of tests about the maximum output pressure of the miniature pneumatic device 1 corresponding to different values of x are performed. In case that $x \leq 0$ μm, the miniature pneumatic device 1 generates noise. In case that $x=1$ μm~5 μm, the maximum output pressure of the miniature pneumatic device 1 reaches 350 mmHg. In case that $x=5$ μm~10 μm, the maximum output pressure of the miniature pneumatic device 1 is 250 mmHg. In case that $x=10$ μm~15 μm, the maximum output pressure of the miniature pneumatic device 1 is 150 mmHg. The relationships between the difference x and the maximum output pressure are listed in Table 2 below. The data shown in Table 2 are obtained when the operating voltage is in the range between ±10V and ±20V. A pressure gradient is generated in the fluid channels of the miniature fluid control device 1A to facilitate the gas to flow at a high speed. Moreover, since there is an impedance difference between the feeding direction and the exiting direction, the gas can be transmitted from the input side to the inner space of the target equipment. Even if the inner space of the target equipment has a certain gas pressure, the miniature fluid control device 1A still has the capability of pushing out the gas as well as achieving the silent efficacy.

TABLE 2

| Test | X | Maximum output pressure |
|---|---|---|
| 1 | x = 1 μm~5 μm | 350 mmHg |
| 2 | x = 5 μm~10 μm | 250 mmHg |
| 3 | x = 10 μm~15 μm | 150 mmHg |

In some embodiments, the vibration frequency of the resonance plate 12 along the vertical direction in the reciprocating manner is identical to the vibration frequency of the piezoelectric actuator 13. That is, the resonance plate 12 and the piezoelectric actuator 13 are synchronously vibrated along the upward direction or the downward direction. It is noted that numerous modifications and alterations of the actions of the miniature fluid control device 1A may be made while retaining the teachings of the invention.

Figure 6A:
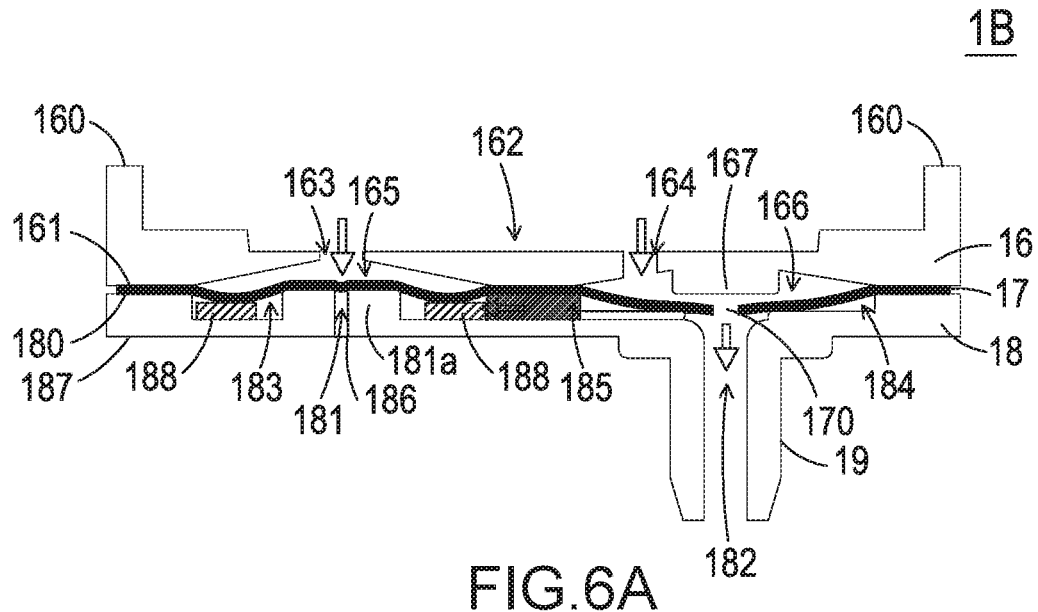
FIG. 6A schematically illustrate a gas-collecting operation of the miniature valve device of the miniature pneumatic device of FIG. 1A.
Figure 6B:
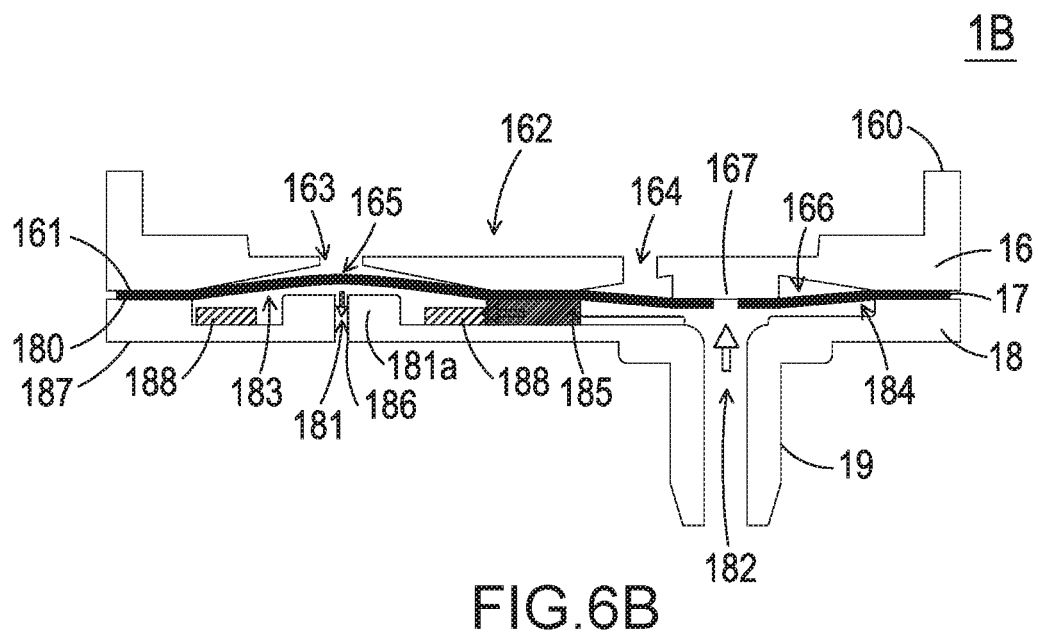
FIG. 6B schematically illustrate a gas-releasing operation of the miniature valve device of the miniature pneumatic device of FIG. 1A.

Please refer to FIGS. 1A, 2A, 6A and 6B. FIG. 6A schematically illustrate a gas-collecting operation of the miniature valve device of the miniature pneumatic device of FIG. 1A. FIG. 6B schematically illustrate a gas-releasing operation of the miniature valve device of the miniature pneumatic device of FIG. 1A. As shown in FIGS. 1A and 6A, the valve film 17 and the gas outlet plate 18 of the miniature valve device 1B are stacked on each other sequentially. Moreover, the miniature valve device 1B cooperates with the gas collecting plate 16 of the miniature fluid control device 1A.

In this embodiment, the gas collecting plate 16 comprises a first surface 160 and a second surface 161 (also referred as a fiducial surface). The first surface 160 of the gas collecting plate 16 is concaved to define a gas-collecting chamber 162 which accommodates the piezoelectric actuator 13. The gas that is transferred downwardly by the miniature fluid control device 1A is temporarily accumulated in the gas-collecting chamber 162. The gas collecting plate 16 has a first perforation 163 and a second perforation 164. A first end of the first perforation 163 and a first end of the second perforation 164 are respectively in communication with the gas-collecting chamber 162. A second end of the first perforation 163 and a second end of the second perforation 164 are in communication with a first pressure-releasing chamber 165 and a first outlet chamber 166, which are formed on the second surface 161 of the gas collecting plate 16. Moreover, the gas collecting plate 16 has a raised structure 167 corresponding to the first outlet chamber 166. For example, the raised structure 167 includes but is not limited to a cylindrical post. The raised structure 167 is located at a level higher than the second surface 161 of the gas collecting plate 16. Moreover, a thickness of the raised structure 167 is in a range between 0.1 mm and 0.55 mm, and preferably 0.2 mm.

The length and the width of the gas outlet plate 18 are identical to those of the gas collecting plate 16. The gas outlet plate 18 comprises a pressure-releasing perforation 181, an outlet perforation 182, a first surface 180 (also referred as a fiducial surface) and a second surface 187. The pressure-releasing perforation 181 and the outlet perforation 182 run through the first surface 180 and the second surface 187. The first surface 180 of the gas outlet plate 18 is concaved to define a second pressure-releasing chamber 183 and a second outlet chamber 184. The pressure-releasing perforation 181 is located at a center of the second pressure-releasing chamber 183. The outlet perforation 182 is in communication with the second outlet chamber 184. Moreover, the gas outlet plate 18 further comprises a communication channel 185 between the second pressure-releasing chamber 183 and the second outlet chamber 184 for allowing the gas to go through. A first end of the outlet perforation 182 is in communication with the second outlet chamber 184. A second end of the outlet perforation 182 is in communication with an outlet structure 19 to gain access to the inner space of the target equipment. The outlet structure 19 is in connected with the target equipment (not shown). The equipment is for example but not limited to a gas-pressure driving equipment.

The valve film 17 comprises a valve opening 170 and plural positioning openings 171 (see FIG. 1A). The thickness of the valve film 17 is in the range between 0.1 mm and 0.3 mm, and preferably 0.2 mm.

After the gas collecting plate 16, the valve film 17 and the gas outlet plate 18 are combined together, the pressure-releasing perforation 181 of the gas outlet plate 18 is aligned with the first perforation 163 of the gas collecting plate 16, the second pressure-releasing chamber 183 of the gas outlet plate 18 is aligned with the first pressure-releasing chamber 165 of the gas collecting plate 16, and the second outlet chamber 184 of the gas outlet plate 18 is aligned with the first outlet chamber 166 of the gas collecting plate 16. The valve film 17 is arranged between the gas collecting plate 16 and the gas outlet plate 18 for blocking the communication between the first pressure-releasing chamber 165 and the second pressure-releasing chamber 183. The valve opening 170 of the valve film 17 is arranged between the second perforation 164 and the outlet perforation 182. Moreover, the valve opening 170 of the valve film 17 is aligned with the raised structure 167 corresponding to the first outlet chamber 166 of the gas collecting plate 16. Due to such arrangement of the single valve opening 170, the gas can be transferred through the miniature valve device 1B in one direction in response to the pressure difference.

In this embodiment, the gas outlet plate 18 has the convex structure 181a beside a first end of the pressure-releasing perforation 181. Preferably but not exclusively, the convex structure 181a is a cylindrical post. The thickness of the convex structure 181a is in the range between 0.1 mm and 0.55 mm, and preferably 0.2 mm. The top surface of the convex structure 181a is located at a level higher than the first surface 180 of the gas outlet plate 18. Consequently, the pressure-releasing perforation 181 can be quickly contacted with and closed by the valve film 17. Moreover, the convex structure 181a can provide a pre-force against the valve film 17 to achieve a good sealing effect. In this embodiment, the gas outlet plate 18 further comprises a position-limiting structure 188. The thickness of the position-limiting structure 188 is 0.2 mm. The position-limiting structure 188 is disposed within the second pressure-releasing chamber 183. Preferably but not exclusively, the position-limiting structure 188 is a ring-shaped structure. While the gas-collecting operation of the miniature valve device 1B is performed, the position-limiting structure 188 can assist in supporting the valve film 17 and avoid collapse of the valve film 17. Consequently, the valve film 17 can be opened or closed more quickly.

Hereinafter, the gas-collecting operation of the miniature valve device 1B will be illustrated with reference to FIG. 6A. In case that the gas from the miniature fluid control device 1A is being transferred downwardly to the miniature valve device 1B, or the ambient air pressure is higher than the inner pressure of the target equipment which is in communication with the outlet structure 19, the gas will be transferred from the miniature fluid control device 1A to the gas-collecting chamber 162 of the miniature valve device 1B. Then, the gas is transferred downwardly to the first pressure-releasing chamber 165 and the first outlet chamber 166 through the first perforation 163 and the second perforation 164. In response to the downward gas, the flexible valve film 17 is subjected to a downward curvy deformation. Consequently, the volume of the first pressure-releasing chamber 165 is expanded, and the valve film 17 is in close contact with the first end of the pressure-releasing perforation 181 corresponding to the first perforation 163. Under this circumstance, the pressure-releasing perforation 181 of the gas outlet plate 18 is closed, and thus the gas within the second pressure-releasing chamber 183 is not leaked out from the pressure-releasing perforation 181. In this embodiment, the gas outlet plate 18 has the convex structure 181a beside of the first end of the pressure-releasing perforation 181. Due to the arrangement of the convex structure 181a, the pressure-releasing perforation 181 can be quickly closed by the valve film 17. Moreover, the convex structure 181a can provide a pre-force to achieve a good sealing effect. The position-limiting structure 188 is arranged around the pressure-releasing perforation 181 to assist in supporting the valve film 17 and avoid collapse of the valve film 17. On the other hand, the gas is transferred downwardly to the first outlet chamber 166 through the second perforation 164. In response to the downward gas, the valve film 17 corresponding to the first outlet chamber 166 is also subjected to the downward curvy deformation. Consequently, the valve opening 170 of the valve membrane 17 is correspondingly opened to the downward side. Under this circumstance, the gas is transferred from the first outlet chamber 166 to the second outlet chamber 184 through the valve opening 170. Then, the gas is transferred to the outlet structure 19 through the outlet perforation 182 and then transferred to the inner space of the target equipment which is in communication with the outlet structure 19. Consequently, the purpose of collecting the gas pressure is achieved.

Hereinafter, the gas-releasing operation of the miniature valve device 1B will be illustrated with reference to FIG. 6B. For performing the gas-releasing operation, the user may adjust the amount of the gas to be fed into the miniature fluid control device 1A, so that the gas is no longer transferred to the gas-collecting chamber 162. Alternatively, in case that the inner pressure of the target equipment which is in communication with the outlet structure 19 is higher than the ambient air pressure, which means the gas pressure of the inner space of the target equipment is greater than the gas pressure of the input side, the gas-releasing operation may be performed. Under this circumstance, the gas is transferred from the outlet structure 19 to the second outlet chamber 184 through the outlet perforation 182. Consequently, the volume of the second outlet chamber 184 is expanded, and the flexible valve film 17 corresponding to the second outlet chamber 184 is subjected to the upward curvy deformation. In addition, the valve film 17 is in close contact with the gas collecting plate 16. Consequently, the valve opening 170 of the valve film 17 is closed by the gas collecting plate 16. Moreover, the gas collecting plate 16 has the raised structure 167 corresponding to the first outlet chamber 166. Due to the arrangement of the raised structure 167, the flexible valve film 17 can be bent upwardly more quickly. Moreover, the raised structure 167 can provide a pre-force to achieve a good sealing effect of the valve opening 170. Since the valve opening 170 of the valve film 17 is contacted with and closed by the raised structure 167, the gas in the second outlet chamber 184 will not be reversely returned to the first outlet chamber 166. Consequently, the efficacy of avoiding gas leakage is enhanced. Moreover, since the gas in the second outlet chamber 184 is transferred to the second pressure-releasing chamber 183 through the communication channel 185, the volume of the second pressure-releasing chamber 183 is expanded. Consequently, the valve film 17 corresponding to the second pressure-releasing chamber 183 is also subjected to the upward curvy deformation. Since the valve film 17 is no longer in contact with the first end of the pressure-releasing perforation 181, the pressure-releasing perforation 181 is opened. Under this circumstance, the gas in the second pressure-releasing chamber 183 is outputted through the pressure-releasing perforation 181. Consequently, the pressure of the gas is released. Similarly, due to the convex structure 181a beside the pressure-releasing perforation 181 or the position-limiting structure 188 within the second pressure-releasing chamber 183, the flexible valve film 17 can be subjected to the upward curvy deformation more quickly. Consequently, the pressure-releasing perforation 181 can be quickly opened. After the gas-releasing operation in one direction is performed, the gas within inner space of the target equipment is partially or completely exited to the surrounding. Under this circumstance, the gas pressure of the target equipment is reduced.

Figure 7A:
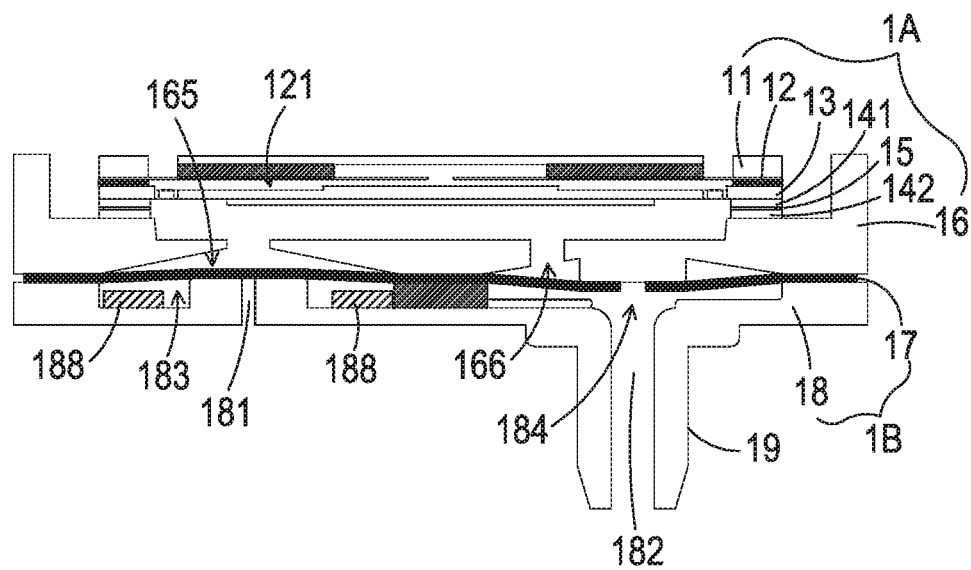
FIGS. 7A to 7E schematically illustrate a gas-collecting operation of the miniature pneumatic device of FIG. 1A.

FIGS. 7A to 7E schematically illustrate the gas-collecting actions of the miniature pneumatic device of FIG. 2A. Please refer to FIGS. 1A, 2A and 7A to 7E. As shown in FIG. 7A, the miniature pneumatic device 1 comprises the miniature fluid control device 1A and the miniature valve device 1B. As mentioned above, the gas inlet plate 11, the resonance plate 12, the piezoelectric actuator 13, the first insulation plate 141, the conducting plate 15, the second insulation plate 142 and the gas collecting plate 16 of the miniature fluid control device 1A are stacked on each other sequentially. There is a gap g0 between the resonance plate 12 and the piezoelectric actuator 13. Moreover, the first chamber 121 is formed between the resonance plate 12 and the piezoelectric actuator 13. The valve film 17 and the gas outlet plate 18 of the miniature valve device 1B are stacked on each other and disposed under the gas collecting plate 16 of the miniature fluid control device 1A. The gas-collecting chamber 162 is arranged between the gas collecting plate 16 and the piezoelectric actuator 13. The first pressure-releasing chamber 165 and the first outlet chamber 166 are formed in the second surface 161 of the gas collecting plate 16. The second pressure-releasing chamber 183 and the second outlet chamber 184 are concavely formed in the first surface 180 of the gas outlet plate 18. In an embodiment, the operating voltage of the miniature pneumatic device 1 is in the range between ±10V and ±16V. Moreover, due to the arrangements of the plural pressure chambers, the actuation of the piezoelectric actuator 13 and the vibration of the plate 12 and the valve film 17, the gas can be transferred downwardly.

Figure 7B:
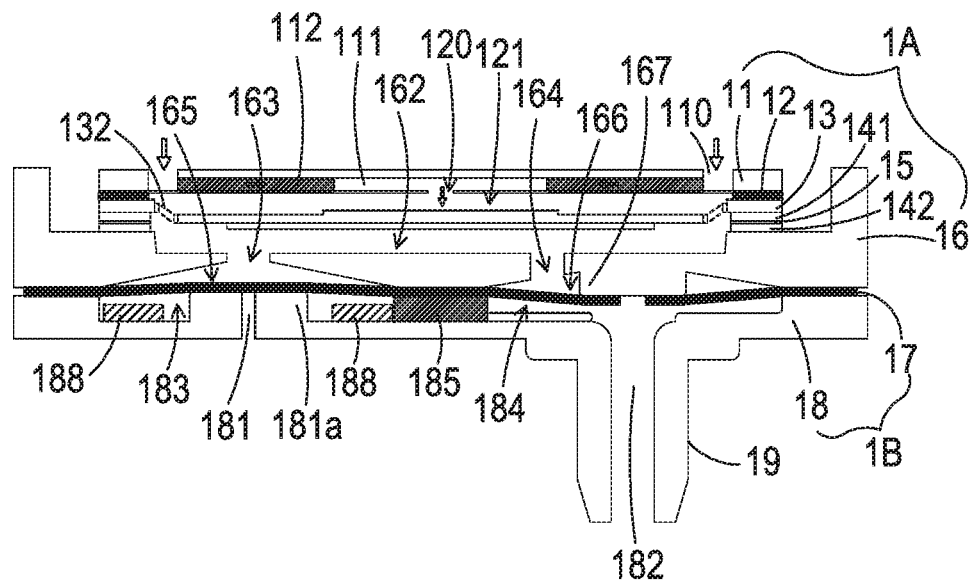

As shown in FIG. 7B, the piezoelectric actuator 13 of the miniature fluid control device 1A is vibrated downwardly in response to the applied voltage. Consequently, the gas is fed into the miniature fluid control device 1A through the at least one inlet 110 of the gas inlet plate 11 from the input side. The gas is sequentially converged to the central cavity 111 through the at least one convergence channel 112 of the gas inlet plate 11, transferred through the central aperture 120 of the resonance plate 12, and introduced downwardly into the first chamber 121.

Figure 7C:
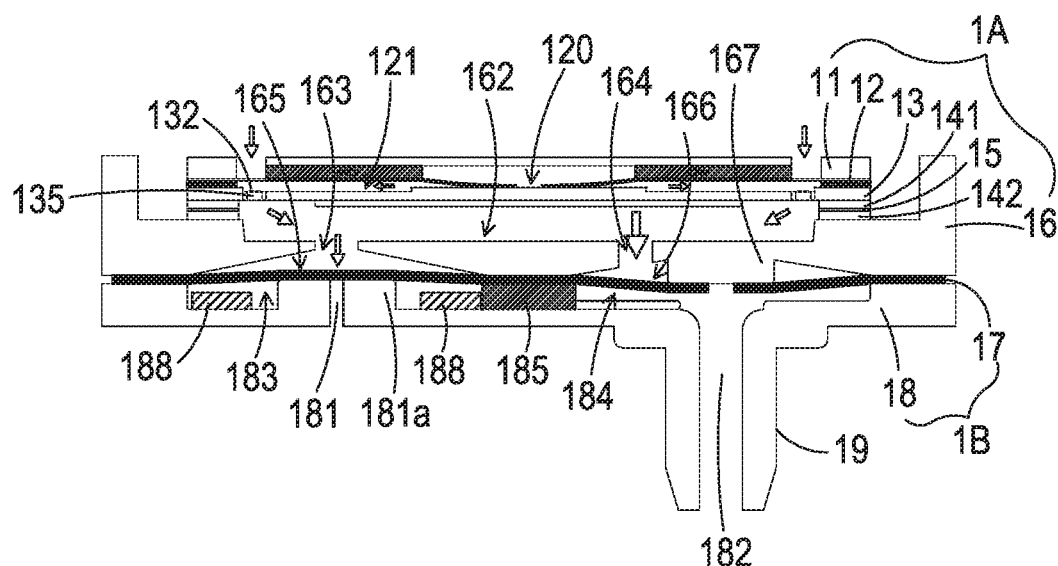

As the piezoelectric actuator 13 is actuated, the resonance of the resonance plate 12 occurs. Consequently, the resonance plate 12 is also vibrated along the vertical direction in the reciprocating manner. As shown in FIG. 7C, the resonance plate 12 is vibrated downwardly and contacted with the bulge 130c of the suspension plate 130 of the piezoelectric actuator 13. Due to the deformation of the resonance plate 12, the volume of the chamber corresponding to the central cavity 111 of the gas inlet plate 11 is expanded but the volume of the first chamber 121 is shrunken. Under this circumstance, the gas is pushed toward peripheral regions of the first chamber 121. Consequently, the gas is transferred downwardly through the vacant space 135 of the piezoelectric actuator 13. Then, the gas is transferred to the gas-collecting chamber 162 between the miniature fluid control device 1A and the miniature valve device 1B. After that, the gas is transferred downwardly to the first pressure-releasing chamber 165 and the first outlet chamber 166 through the first perforation 163 and the second perforation 164, which are in communication with the gas-collecting chamber 162. Consequently, when the resonance plate 12 is vibrated along the vertical direction in the reciprocating manner, the gap g0 between the resonance plate 12 and the piezoelectric actuator 13 is helpful to increase the amplitude of the resonance plate 12. That is, due to the gap g0 between the resonance plate 12 and the piezoelectric actuator 13, the amplitude of the resonance plate 12 is increased when the resonance occurs.

Figure 7D:
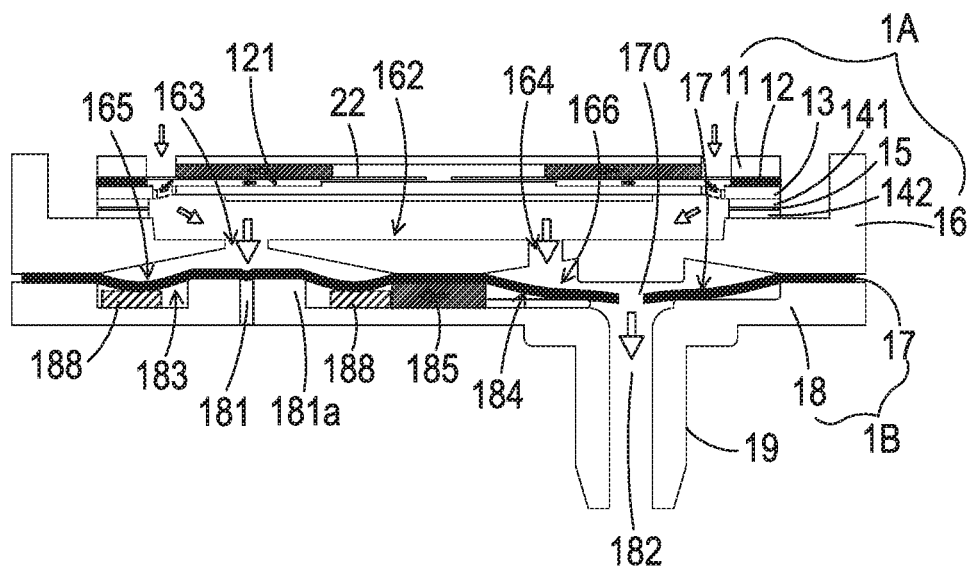

As shown in FIG. 7D, the resonance plate 12 of the miniature fluid control device 1A is returned to its original position, and the piezoelectric actuator 13 is vibrated upwardly in response to the applied voltage. The difference x between the gap g0 and the vibration displacement d of the piezoelectric actuator 13 is given by a formula: $x=g0-d$. A series of tests about the maximum output pressure of the miniature pneumatic device 1 corresponding to different values of x are performed. The operating voltage of the miniature pneumatic device 1 is in the range between ±10V and ±16V. In case that x=1 μm~5 μm, the maximum output pressure of the miniature pneumatic device 1 is at least 300 mmHg. Consequently, the volume of the first chamber 121 is also shrunken, and the gas is continuously pushed toward peripheral regions of the first chamber 121. Moreover, the gas is continuously transferred to the gas-collecting chamber 162, the first pressure-releasing chamber 165 and the first outlet chamber 166 through the vacant space 135 of the piezoelectric actuator 13. Consequently, the pressure in the first pressure-releasing chamber 165 and the first outlet chamber 166 will be gradually increased. In response to the increased gas pressure, the flexible valve film 17 is subjected to the downward curvy deformation. Consequently, the valve film 17 corresponding to the second pressure-releasing chamber 183 is moved downwardly and contacted with the convex structure 181a corresponding to the first end of the pressure-releasing perforation 181. Under this circumstance, the pressure-releasing perforation 181 of the gas outlet plate 18 is closed. In the second outlet chamber 184, the valve opening 170 of the valve film 17 corresponding to the outlet perforation 182 is opened downwardly. Then, the gas within the second outlet chamber 184 is transferred downwardly to the outlet structure 19 through the outlet perforation 182 and then transferred to the inner space of the target equipment which is in communication with the outlet structure 19. Consequently, the inner space of the target equipment is pressurized, and the purpose of collecting the gas pressure is achieved.

Figure 7E:
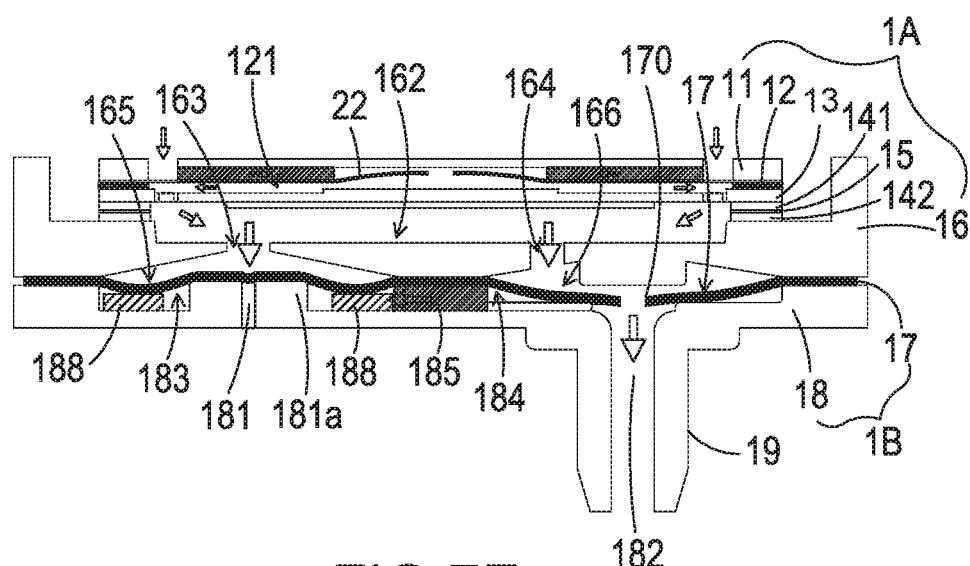

Then, as shown in FIG. 7E, the resonance plate 12 of the miniature fluid control device 1A is vibrated upwardly. Under this circumstance, the gas in the central cavity 111 of the gas inlet plate 11 is transferred to the first chamber 121 through the central aperture 120 of the resonance plate 12, and then the gas is transferred downwardly to the miniature valve device 1B through the vacant space 135 of the piezoelectric actuator 13. As the gas pressure is continuously increased along the downward direction, the gas is continuously transferred to the gas-collecting chamber 162, the second perforation 164, the first outlet chamber 166, the second outlet chamber 184 and the outlet perforation 182 and then transferred to the target equipment which is in communication with the outlet structure 19. Such pressure-collecting operation may be but not limited to be triggered by the pressure difference between the ambient pressure of the input side and the gas pressure of the inner space of the target equipment.

Figure 8:
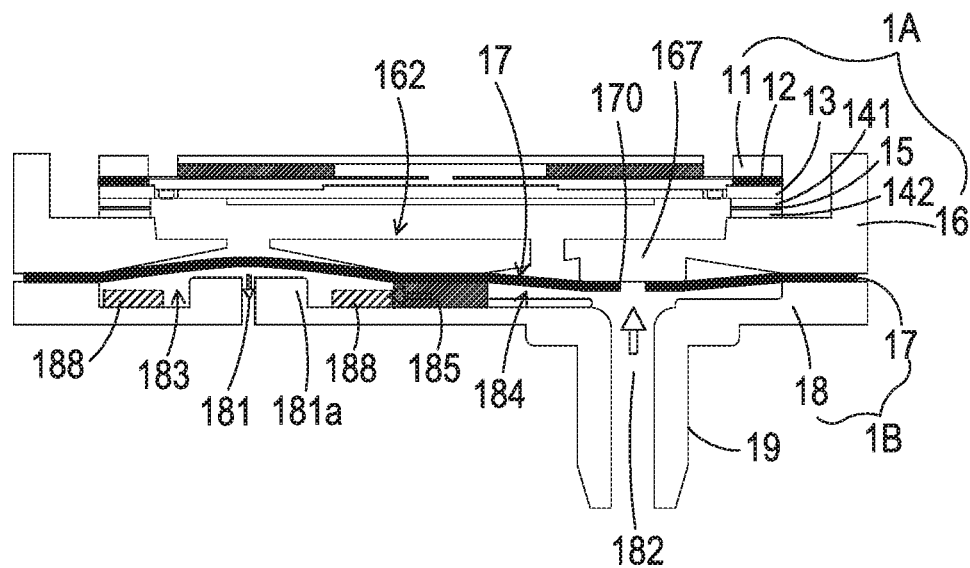
FIG. 8 schematically illustrate the gas-releasing actions or the pressure-reducing actions of the miniature pneumatic device of FIG. 1A.

FIG. 8 schematically illustrate the gas-releasing actions or the pressure-reducing actions of the miniature pneumatic device of FIG. 1A. In case that the inner pressure of the target equipment is greater than the ambient air pressure of the input side, the gas-releasing operation (or a pressure-reducing operation) may be performed. As mentioned above, the user may adjust the amount of the gas to be fed into the miniature fluid control device 1A, so that the gas is no longer transferred to the gas-collecting chamber 162. Under this circumstance, the gas is transferred from the outlet structure 19 to the second outlet chamber 184 through the outlet perforation 182. Consequently, the volume of the second outlet chamber 184 is expanded, and the flexible valve film 17 corresponding to the second outlet chamber 184 is bent upwardly. In addition, the valve film 17 is in close contact with the raised structure 167 corresponding to the first outlet chamber 166. Since the valve opening 170 of the valve film 17 is closed by the raised structure 167, the gas in the second outlet chamber 184 will not be reversely returned to the first outlet chamber 166. Moreover, the gas in the second outlet chamber 184 is transferred to the second pressure-releasing chamber 183 through the communication channel 185, and then the gas in the second pressure-releasing chamber 183 is transferred to the pressure-releasing perforation 181. Under this circumstance, the gas-releasing operation is performed. After the gas-releasing operation of the miniature valve device 1B in one direction is performed, the gas within the inner space of the target equipment is partially or completely exited to the surrounding. Under this circumstance, the inner pressure of the equipment is reduced.

The performance data of the miniature pneumatic device 1 with different sizes of square suspension plates 130 are listed in Table 3.

TABLE 3

| | Side length of square suspension plate | | | | | |
| --- | --- | --- | --- | --- | --- | --- |
| | 2 mm | 2.5 mm | 3.5 mm | 4 mm | 4.5 mm | 5 mm |
| Defect rate | 1/20 = 5% | 1/20 = 5% | 2/20 = 10% | 3/20 = 15% | 3/20 = 15% | 5/20 = 25% |

The results of the above table are obtained by testing 20 random samples of the miniature pneumatic device 1 with each different size of square suspension plates 130. When the side length of the square suspension plate 130 is in the range between 2.5 mm and 3.5 mm, the maximum output pressure of the miniature pneumatic device 1 can reach over 300 mmHg, and the defect rate is reduced. The reason of reduction of defect rate is supposed to be that smaller size brings greater rigidity of the suspension plate 130. With greater rigidity, horizontal deformation of the suspension plate 130 is reduced when it is vibrating vertically, and the vibration of the piezoelectric actuator 13 can be steady in the fixed direction during operation. Thus, the collision interference between the suspension plate 130 and the resonance plate 12 or other components can be reduced, and a specified distance between the suspension plate 130 and the resonance plate 12 is maintained that reducing the noise. Hence, the results of the quality tests of the final products show that the number of the unqualified product is obviously reduced. In other words, the quality performance of the product is enhanced. Moreover, as the size of the suspension plate 130 is reduced, the size of the piezoelectric actuator 13 can be correspondingly made in smaller size. Under this circumstance, the volume of the gas channel is reduced and the efficacy of pushing or compressing the gas is increased. Consequently, the miniature pneumatic device 1 of the present invention has enhanced performance and smaller size. By contrast, in case that the suspension plate 130 and the piezoelectric ceramic plate 133 of the piezoelectric actuator are larger, the suspension plate 130 is readily suffered from distortion during vibration because the rigidity of the suspension plate 130 is deteriorated. If the distortion of the suspension plate 130 occurs, the collision interference between the suspension plate 130 and the resonance plate 12 or other components is easily happened and thus the noise is generated. The noise problem may result in the defective product. That is, as the sizes of the suspension plate 130 and the size of the piezoelectric ceramic plate 133 are increased, the defect rate of the miniature pneumatic device 1 is increased. By reducing the size of the suspension plate 130 and the size of the piezoelectric ceramic plate 133, the performance of the miniature pneumatic device 1 is increased, the noise is reduced, and the defect rate is reduced.

The fact that the size reduction of the suspension plate 130 increases the performance and maximum output pressure is realized according to the results of experiments rather than theoretical mathematic formulae.

After the miniature fluid control device 1A and the miniature valve device 1B are combined together, the total thickness of the miniature pneumatic device 1 is in the range between 1.5 mm and 4 mm. Since the miniature pneumatic device is slim and portable, the miniature pneumatic device is suitably applied to medical equipment or any other appropriate equipment.

From the above descriptions, the present invention provides the miniature pneumatic device. The miniature pneumatic device comprises the miniature fluid control device and the miniature valve device. After the gas is fed into the miniature fluid control device through the inlet, the piezoelectric actuator is actuated. Consequently, a pressure gradient is generated in the fluid channels of the miniature fluid control device and the gas-collecting chamber to facilitate the gas to flow to the miniature valve device at a high speed. Moreover, due to the one-way valve film of the miniature valve device, the gas is transferred in one direction. Consequently, the pressure of the gas is accumulated to any equipment that is connected with the outlet structure, which is referred as the target equipment above. For performing a gas-releasing operation (or a pressure-reducing operation), the user may adjust the amount of the gas to be fed into the miniature fluid control device, so that the gas is no longer transferred to the gas-collecting chamber. Under this circumstance, the gas is transferred from the outlet structure to the second outlet chamber of the miniature valve device, then transferred to the second pressure-releasing chamber through the communication channel, and finally exited from the pressure-releasing perforation. By the miniature pneumatic device of the present invention, the gas can be quickly transferred while achieving silent efficacy. Moreover, due to the special configurations, the miniature pneumatic device of the present invention has small volume and small thickness. Consequently, the miniature pneumatic device is portable and suitable to be applied to medical equipment or any other appropriate equipment. In other words, the miniature pneumatic device of the present invention has significant advantages that creating industrial values.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A miniature pneumatic device, comprising:
   a miniature fluid control device comprising:
   a gas inlet plate;
   a resonance plate having a central aperture;
   a piezoelectric actuator; and
   a gas collecting plate, wherein a length of the gas collecting plate is in a range between 4 mm and 10 mm, a width of the gas collecting plate is in a range between 4 mm and 10 mm, and a length/width ratio of the gas collecting plate is in a range between 0.4 and 2.5, and wherein the gas collecting plate comprises a first perforation, a second perforation, a first pressure-releasing chamber, a first outlet chamber and a fiducial surface, wherein the first perforation is in communication with the first pressure-releasing chamber, and the second perforation is in communication with the first outlet chamber,
   wherein the gas inlet plate, the resonance plate, the piezoelectric actuator and the gas collecting plate are stacked on each other sequentially, and a gap is formed between the resonance plate and the piezoelectric actuator to define a first chamber, wherein when the piezoelectric actuator is actuated, a gas is fed into the miniature fluid control device through the gas inlet plate, transferred through the resonance plate, introduced into the first chamber, and further transferred; and a miniature valve device comprising a valve film and a gas outlet plate, wherein the gas collecting plate, the valve film and the gas outlet plate are combined together, the valve film has a valve opening, and a length and a width of the gas outlet plate are identical to those of the gas collecting plate, wherein the gas outlet plate comprising a pressure-releasing perforation, an outlet perforation, a second pressure-releasing chamber, a second outlet chamber, at least one position-limiting structure and a fiducial surface, wherein the second pressure-releasing chamber and the second outlet chamber are concavely formed in the fiducial surface of the gas outlet plate, the pressure-releasing perforation is located at a center of the second pressure-releasing chamber, a convex structure is located beside an end of the pressure-releasing perforation, the convex structure is located at a level higher than the fiducial surface of the gas outlet plate, the outlet perforation is in communication with the second outlet chamber, the at least one position-limiting structure is disposed within the second pressure-releasing chamber, and the gas outlet plate further comprises a communication channel between the second pressure-releasing chamber and the second outlet chamber, wherein the gas collecting plate, the valve film and the gas outlet plate are combined together, the pressure-releasing perforation of the gas outlet plate is aligned with the first perforation of the gas collecting plate, the second pressure-releasing chamber of the gas outlet plate is aligned with the first pressure-releasing chamber of the gas collecting plate, and the second outlet chamber of the gas outlet plate is aligned with the first outlet chamber of the gas collecting plate, and the at least one position-limiting structure has a thickness of 0.2 mm and assists in supporting the valve film to avoid collapse of the valve film, wherein the valve film is arranged between the gas collecting plate and the gas outlet plate for blocking communication between the first pressure-releasing chamber and the second pressure-releasing chamber, wherein after the gas is downwardly transferred from the miniature fluid control device to the miniature valve device, the gas is introduced into the first pressure-releasing chamber and the first outlet chamber through the first perforation and the second perforation, and the valve film is contacted with the convex structure of the gas outlet plate to provide a pre-force to close the pressure-releasing perforation, and the gas within the first outlet chamber is further transferred to the outlet perforation of the miniature valve device through the valve opening of the valve film, so that the pressure-collecting operation is performed, wherein while the pressure-releasing operation is performed, the gas is transferred from the outlet perforation to the second outlet chamber to move the valve film, the valve opening of the valve film is contacted with and closed by the gas collecting plate, the gas is transferred from the second outlet chamber to the second pressure-releasing chamber through the communication channel, the valve film corresponding to the second pressure-releasing chamber is moved, and the gas is exited from the pressure-releasing perforation, whereby after the gas is transferred from the miniature fluid control device to the miniature valve device, a pressure-collecting operation or a pressure-releasing operation is selectively performed.

* * * * *